United States Patent
Ueno et al.

(10) Patent No.: US 7,394,952 B1
(45) Date of Patent: Jul. 1, 2008

(54) OPTICAL TRANSMISSION DEVICE AND OPTICAL MODULE

(75) Inventors: Osamu Ueno, Ashigarakami-gun (JP); Shigemi Ohtsu, Ashigarakami-gun (JP); Keishi Shimizu, Ashigarakami-gun (JP); Eiichi Akutsu, Ashigarakami-gun (JP)

(73) Assignee: Fuji Xerox Co., Ltd., Tokyo (JP)

( * ) Notice: Subject to any disclaimer, the term of this patent is extended or adjusted under 35 U.S.C. 154(b) by 45 days.

(21) Appl. No.: 11/332,308

(22) Filed: Jan. 17, 2006

(30) Foreign Application Priority Data

Jan. 18, 2005 (JP) ............................. 2005-010957

(51) Int. Cl.
 *G02B 6/12* (2006.01)
 *G02B 6/26* (2006.01)
(52) U.S. Cl. .............................. 385/14; 385/52; 385/15
(58) Field of Classification Search .................... 385/14, 385/15, 52
See application file for complete search history.

(56) References Cited

U.S. PATENT DOCUMENTS

| | | | | |
|---|---|---|---|---|
| 5,229,879 | A * | 7/1993 | Gen-ei | 359/344 |
| 5,488,678 | A * | 1/1996 | Taneya et al. | 385/14 |
| 5,771,322 | A * | 6/1998 | Matsumoto et al. | 385/31 |
| 6,043,550 | A * | 3/2000 | Kuhara et al. | 257/461 |
| 6,256,437 | B1 * | 7/2001 | Sakushima et al. | 385/49 |
| 6,575,641 | B2 * | 6/2003 | Yamabayashi et al. | 385/88 |
| 6,748,143 | B2 * | 6/2004 | Kuhara et al. | 385/49 |
| 7,171,066 | B1 * | 1/2007 | Sakai et al. | 385/14 |
| 2002/0057876 | A1 * | 5/2002 | Yamabayashi et al. | 385/88 |
| 2002/0067751 | A1 * | 6/2002 | Ohbuchi | 372/45 |
| 2003/0123819 | A1 * | 7/2003 | Nakanishi et al. | 385/92 |
| 2003/0210866 | A1 * | 11/2003 | Kuhara et al. | 385/49 |
| 2003/0231829 | A1 * | 12/2003 | Meyers et al. | 385/33 |
| 2003/0231841 | A1 * | 12/2003 | Nakanishi et al. | 385/92 |
| 2004/0264888 | A1 * | 12/2004 | Go | 385/92 |
| 2007/0051877 | A1 * | 3/2007 | Sakai et al. | 250/214 R |

FOREIGN PATENT DOCUMENTS

| | | | |
|---|---|---|---|
| EP | 660146 | A1 * | 6/1995 |
| JP | A 05-093825 | | 4/1993 |
| JP | A 05-224044 | | 9/1993 |
| JP | A 08-330661 | | 12/1996 |
| JP | 10227951 | A * | 8/1998 |
| JP | A 10-227951 | | 8/1998 |
| JP | A 11-119006 | | 4/1999 |
| JP | A 11-271548 | | 10/1999 |
| JP | A 11-330624 | | 11/1999 |
| JP | A 2003-329892 | | 11/2003 |
| JP | A 2004-212774 | | 7/2004 |
| JP | A 2004-226941 | | 8/2004 |

* cited by examiner

*Primary Examiner*—Kianni C Kaveh
(74) *Attorney, Agent, or Firm*—Oliff & Berridge, PLC

(57) ABSTRACT

An optical module comprises: a surface-type optical element having at least one of a light emitting face and a light receiving face on the back of a mounting face; an optical waveguide for transmitting light in the direction of a normal line of the mounting face; and a mounting portion having an element positioning portion for positioning the surface-type optical element and an optical waveguide positioning portion for positioning the optical waveguide, the mounting portion being mounted with the surface-type optical element and the optical waveguide.

10 Claims, 26 Drawing Sheets

OPTICAL TRANSMISSION DEVICE AND OPTICAL MODULE

CROSS-REFERENCE TO RELATED APPLICATION

This application claims priority under 35 USC 119 from Japanese Patent Application Nos. 2005-10957, the disclosure of which is incorporated by reference herein.

BACKGROUND OF THE INVENTION

1. Field of the Invention

The present invention relates to an optical transmission device and optical module including a surface-type optical element and optical waveguide.

2. Description of the Related Art

Conventionally, an optical transmission device using a surface-type optical element in which a light emitting portion and a light receiving portion are formed on the back of a mounting face, such as a surface emitting laser (VCSEL) and photodiode, has been well known as a low cost optical transmission device (see, for example, Japanese Patent Application Laid-Open (JP-A) No. 2004-226941, JP-A No. 2004-212774, JP-A No. 2003-329892, JP-A No. 11-271548, JP-A No. 05-093825, JP-A No. 10-227951, JP-A No. 11-119006, JP-A No. 08-330661, JP-A No. 05-224044, and JP-A No. 11-330624). Then, employment of the optical waveguide for optical coupling between an external optical transmission medium such as an optical fiber and the surface-type optical element has been considered for reduction of the size and cost and giving high functionality of the optical transmission device.

As for the mounting direction of the optical waveguide, it is possible to consider mounting the optical waveguide in parallel to the mounting face of the surface-type optical element and mounting it in a vertical direction thereto, and usually, a 45-degree plane 220 is formed in an optical waveguide 218 as shown in FIG. 26 from viewpoints of ease in holding and positioning and a surface-type optical element 222 is mounted such that a light emitting face 222L thereof is in parallel to the optical waveguide 218 (see JP-A No. 2004-226941).

However, this method requires processing of forming such 45-degree plane in the optical waveguide, whereby leading to increase in manufacturing cost and such a problem that a highly reliable package (for example, metal can package) which emit light vertically to the mounting face cannot be used.

As a method for mounting the optical waveguide vertically with respect to the mounting face of the optical element, a method of providing the optical waveguide with a concave portion and then positioning optically with this as a criterion has been proposed (see for example, JP-A No. 2004-212774).

However, this method has not only a weak point that the optical waveguide cost and mounting cost both increase but also a drawback that plural surface-type optical elements cannot be positioned to match with a single optical waveguide easily.

SUMMARY OF THE INVENTION

A present invention has been made in view of the above circumstances and provides an optical transmission device and optical module in which an optical waveguide is disposed vertically with respect to the mounting face of the surface-type optical element at a very high precision, by considering the above-described problems.

According to a first aspect of the invention, there is provided an optical module comprising: a surface-type optical element having at least one of a light emitting face and a light receiving face on the back of a mounting face; an optical waveguide that transmits light in the direction of a normal line of the mounting face; and a mounting portion that has an element positioning portion for positioning the surface-type optical element and an optical waveguide positioning portion for positioning the optical waveguide, and the mounting position being mounted with the surface-type optical element and the optical waveguide.

As a consequence, the optical waveguide can be mounted to the mounting face of the surface-type optical element highly accurately and the optical coupling efficiency between the surface-type optical element and the optical waveguide is high and the optical coupling efficiency with other optical module can be intensified.

With a transparent member provided on a side opposing the mounting portion of the optical waveguide, a gap between the transparent member and the optical waveguide may be filled with matching member having a refraction index close to those of the both. Consequently, the quantity of reflected light by the optical waveguide end face is reduced, thereby reducing a bad influence by reflection light.

According to a second aspect of the invention, there is provided the optical module according to the first aspect, further comprising a light transmission medium mounting portion installed in the direction of the normal line of the mounting face, wherein the optical waveguide optically couples the surface-type optical element with the light transmission medium mounting portion.

As a consequence, the optical module can be coupled optically easily at a high positioning accuracy.

According to a third aspect of the invention, there is provided the optical module according to the first aspect, further comprising a sealing member that seals the surface-type optical element, the optical waveguide and the mounting portion.

As a consequence, dust and dirt from outside are blocked from adhering to the surface-type optical element or the optical waveguide.

According to a fourth aspect of the invention, there is provided the optical module according to the third aspect, wherein the sealing member is composed of resin material.

As a consequence, reduction in manufacturing cost can be achieved.

According to a fifth aspect of the invention, there is provided the optical module according to the first aspect, wherein the mounting portion is a sub-mount.

As a consequence, the mounting portion can be handled easily and a highly accurate positioning can be executed stably.

According to a sixth aspect of the invention, there is provided the optical module according to the first aspect, wherein the mounting portion is a contoured portion of a header member.

Because the header portion to be equipped with the optical element and the like has a contoured surface, highly accurate positioning can be executed without increasing the quantity of components.

According to a seventh aspect of the invention, there is provided the optical module according to the first aspect, further comprising a positioning mechanism that positions the side face of the optical waveguide which is perpendicular to the thickness direction of the optical waveguide, as the optical waveguide positioning portion.

As a consequence, the optical waveguide can be positioned highly accurately.

According to an eighth aspect of the invention, there is provided the optical module according to the seventh aspect, wherein, on the side of the positioning mechanism of the optical waveguide, a distance from the side face to the light introducing path of the optical waveguide is shorter than a distance from the light emitting portion or light receiving portion of the surface-type optical element to an electrode portion of the surface-type optical element.

As a consequence, with the optical waveguide disposed on the top face of the surface-type optical element, the surface-type optical element can be wire-bonded easily.

According to a ninth aspect of the invention, there is provided the optical module according to the eighth aspect, wherein a distance from the side face to the light introducing path of the optical waveguide is less than approximately 100 μm.

As a consequence, most of the surface-type optical elements can be wire-bonded easily.

According to a tenth aspect of the invention, there is provided the optical module according to the fifth aspect, wherein the surface-type optical element is recessed in the sub-mount.

As a consequence, mounting of the surface-type optical element can be carried out at a high positioning precision.

According to an eleventh aspect of the invention, there is provided the optical module according to the tenth aspect, wherein the sub-mount is composed of a silicone member processed by reactive ion etching.

As a consequence, the sub-mount can be processed at a high precision thereby intensifying the positioning accuracy.

According to a twelfth aspect of the invention, there is provided the optical module according to the first aspect, wherein the surface-type optical element and the optical waveguide are sealed in a metal can package.

As a consequence, a highly reliable optical module less affected by humidity can be provided.

According to a thirteenth aspect of the invention, there is provided the optical module according to the first aspect, wherein a plurality of the surface-type optical elements are provided.

As a consequence, the effect described in the first aspect can be exerted remarkably.

If a metal can package is formed wherein two surface-type optical elements and optical module having a plurality of pins are provided, the pins may be disposed in two columns separately and a signal exchanged between the two surface-type optical elements may be allocated to pins of different columns. As a result, electric crosstalk can be reduced.

According to a fourteenth aspect of the invention, there is provided the optical module according to the first aspect, wherein a light emitting element and a light receiving element are provided as the surface-type optical element.

As a consequence, a small one-core two-way module can be achieved.

According to a fifteenth aspect of the invention, there is provided the optical module according to the thirteenth aspect, wherein a plurality of light emitting elements each having a different wavelength are provided as the surface-type optical elements.

As a consequence, a small multi-wavelength light emitting module can be provided.

According to a sixteenth aspect of the invention, there is provided the optical module according to the thirteenth aspect, wherein, for introducing light having different wavelengths, a plurality of light receiving elements are provided as the surface-type optical elements and each light receiving element is equipped with a wavelength selecting portion.

As a consequence, a small multi-wavelength light receiving module can be provided.

According to a seventeenth aspect of the invention, there is provided the optical module according to the first aspect, wherein a light emitting element is provided as the surface-type optical element, and an attenuator for attenuating light impinging from the light emitting element is provided in the optical waveguide.

As a consequence, a small optical module in which the safety of laser and high speed drive coexist can be achieved. Further, the waveform of light emitted from the light emitting element is excellent.

According to an eighteenth aspect of the invention, there is provided the optical module according to the seventeenth aspect, wherein a branch path is formed in a light introducing path of the optical waveguide as the attenuator and part of light impinging upon the optical waveguide is guided in a direction away from the light transmission medium through the branch path.

As a consequence, the quantity of light can be controlled at a high precision.

According to a nineteenth aspect of the invention, there is provided the optical module according to the seventeenth aspect, wherein a bent portion that is bent at a curvature larger than a predetermined value is formed in a light introducing path of the optical waveguide as the attenuator, so that part of light impinging on the optical waveguide is allowed to leak from the bent portion.

As a consequence, light can be attenuated with a simple structure.

According to a twentieth aspect of the invention, there is provided an optical transmission device comprising: a surface-type optical element that has at least one of a light emitting face and a light receiving face on the back of a mounting face; a light transmission medium disposed in substantially the direction of a normal line of the mounting face; an optical waveguide that optically couples the surface-type optical element with the light transmission medium and that is disposed in substantially the direction of the normal line of the mounting face; and a mounting portion that has an element positioning portion for positioning the surface-type optical element and an optical waveguide positioning portion for positioning the optical waveguide, and the mounting portion being mounted with the surface-type optical element and the optical waveguide.

As a consequence, the optical waveguide can be mounted vertically to the mounting face of the surface-type optical element at a high positioning accuracy, so that an optical transmission device having a high optical coupling efficiency between the surface-type optical element and the optical waveguide can be provided.

According to a twenty first aspect of the invention, there is provided the optical transmission device according to the twentieth aspect, wherein a plurality of the surface-type optical elements are provided, and the plurality of the surface-type optical elements are optically coupled with a single light transmission medium.

As a consequence, the number of the optical transmission mediums can be reduced largely.

According to a twenty second aspect of the invention, there is provided the optical transmission device according to the twentieth aspect, wherein the optical waveguide and the light transmission medium are optically coupled through a lens.

As a consequence, coupling with the light transmission medium is facilitated so that it can be used as a multi-purpose optical transmission device.

In the above-described invention, it is often the case that the light transmission medium is multi-mode optical fiber and the light emitting element is multi-mode surface-type light emitting laser. Further, the optical waveguide is often multi-mode polymer optical waveguide film duplicated with a mold. However, naturally, the invention is not limited to these light transmission medium, light emitting element or optical waveguide.

Multi-mode optical waveguide and single-mode light emitting element may be used when using the multi-mode optical fiber.

In conclusion, the present invention can achieve an optical transmission device and optical module in which the optical waveguide is disposed vertically to the mounting face of the surface-type optical element at a high precision.

DETAILED DESCRIPTION OF THE INVENTION

Figure 1:
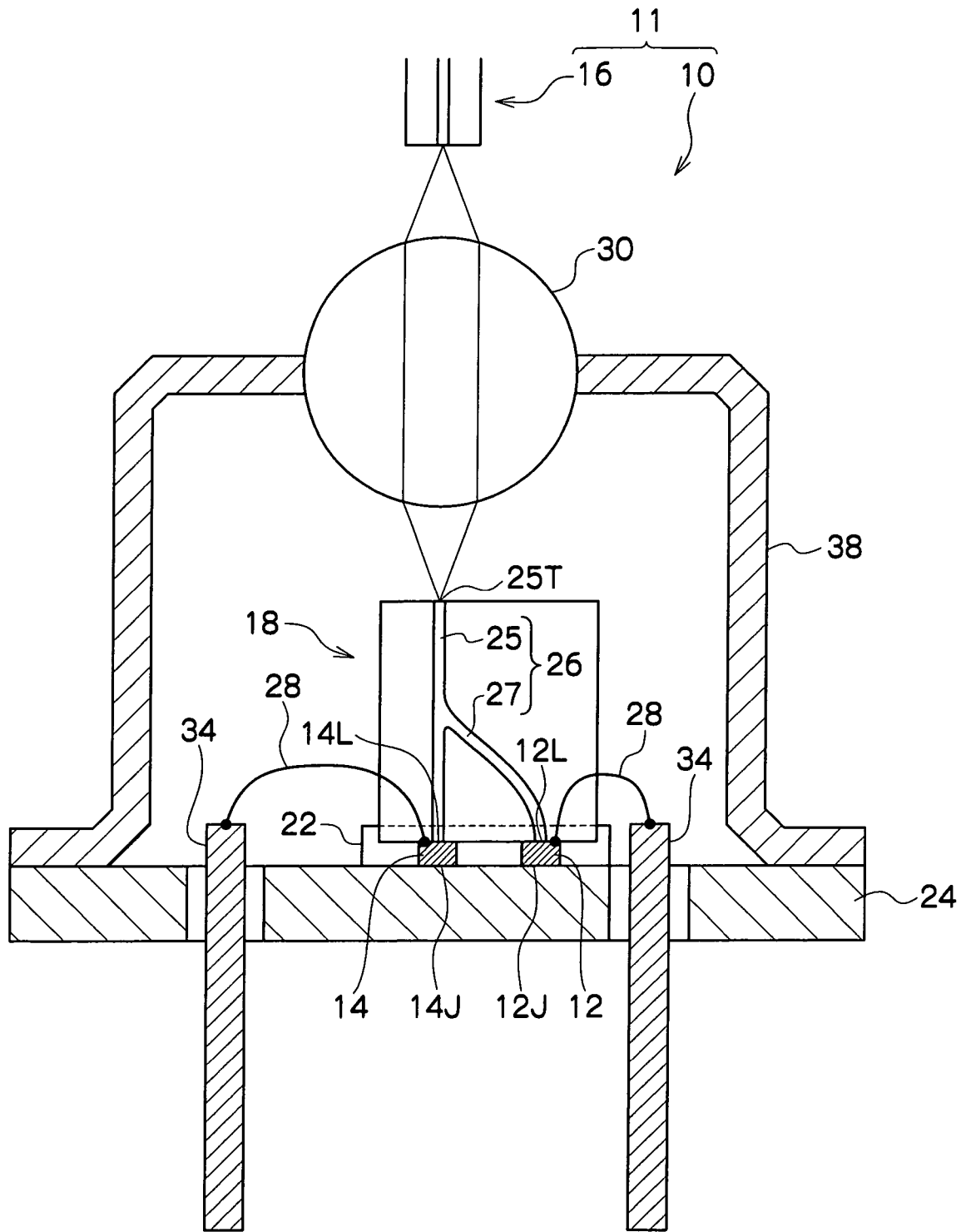
FIG. 1 is a side sectional view showing the structure of an optical transmission device according to a first embodiment.

Hereinafter, preferred embodiments of the present invention will be described. In the second and subsequent embodiments, the description of those components once described before will not be repeated while like reference numerals are attached thereto.

First Embodiment

The first embodiment will be described. An optical transmission device 10 of this embodiment comprises an optical module 11 and an optical fiber 16.

The optical module 11 comprises a surface-type light emitting element 12 having a light emitting face 12L on the back of its mounting face 12J and a surface-type light receiving element 14 having a light receiving face 14L on the back of its mounting face 14J. The mounting faces 12J, 14J are located within the same plane.

The optical module 11 comprises an optical waveguide 18 which optically couples an optical fiber 16 disposed in the direction of normal line of the mounting faces 12J, 14J with the light emitting element 12 and the light receiving element 14, a silicone made sub-mount 22 on which the light emitting element 12, the light receiving element 14 and the optical waveguide 18 are mounted and a base 24 for fixing the sub-mount 22 at a predetermined position. The optical waveguide 18 is composed of a thin plate.

Figure 3:
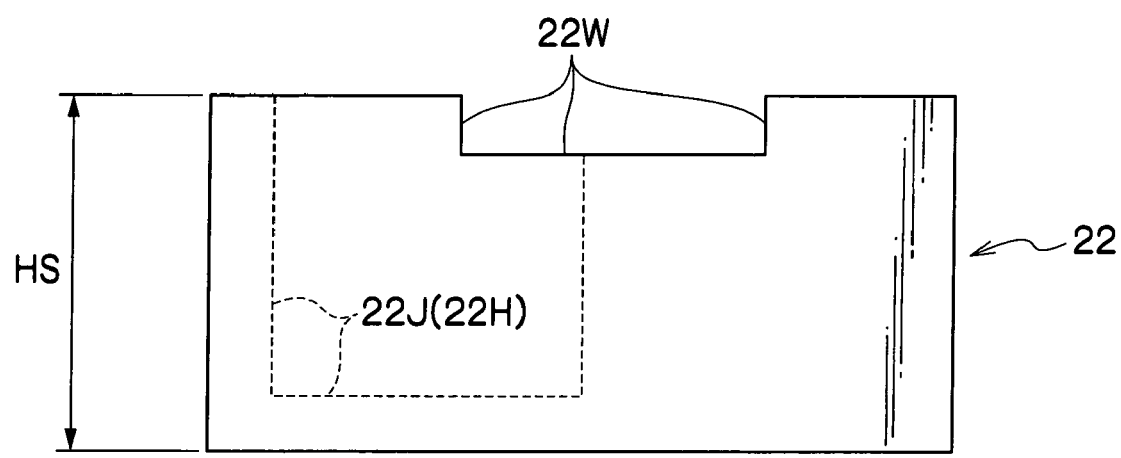
FIG. 3 is a side view of a sub-mount constituting the optical transmission device of the first embodiment.
Figure 4:
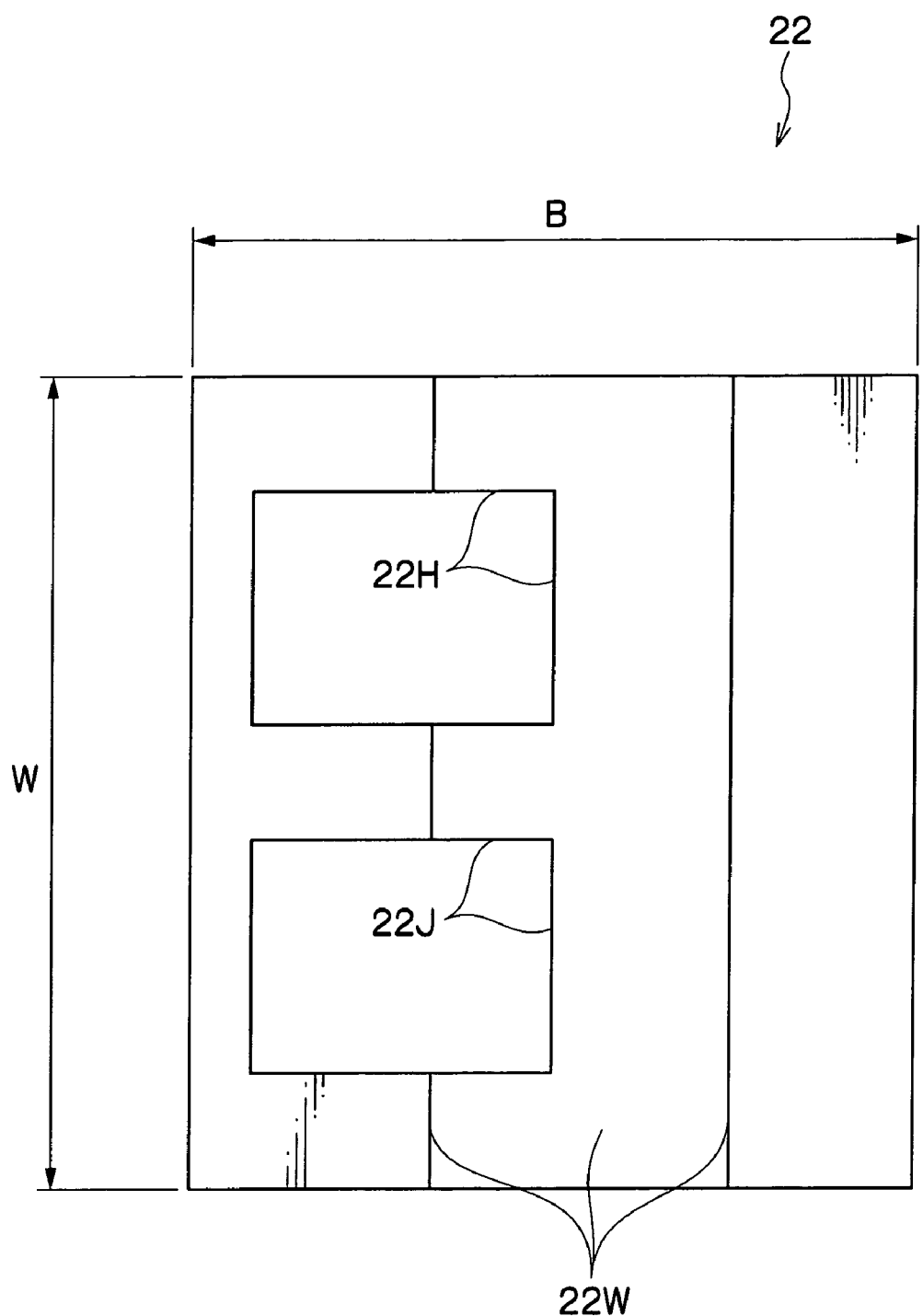
FIG. 4 is a plan view of a sub-mount constituting the optical transmission device of the first embodiment.

As shown in FIGS. 3 and 4, the sub-mount 22 includes a light emitting element positioning portion 22H for positioning the light emitting element 12, a light receiving element positioning portion 22J for positioning the light receiving element 14 and an optical waveguide positioning portion 22W for positioning the optical waveguide 18.

The light emitting element 12 is recessed in the light emitting element positioning portion 22H by being dropped inside and covered with the optical waveguide 18. The light receiving element positioning portion 22J has the same structure. The optical waveguide 18 is positioned by a positioning side face 181 (see FIG. 2) perpendicular to the thickness direction of the optical waveguide 18.

According to this embodiment, the sub-mount 22 is formed by reactive ion etching (RIE) a silicone member.

Figure 5:
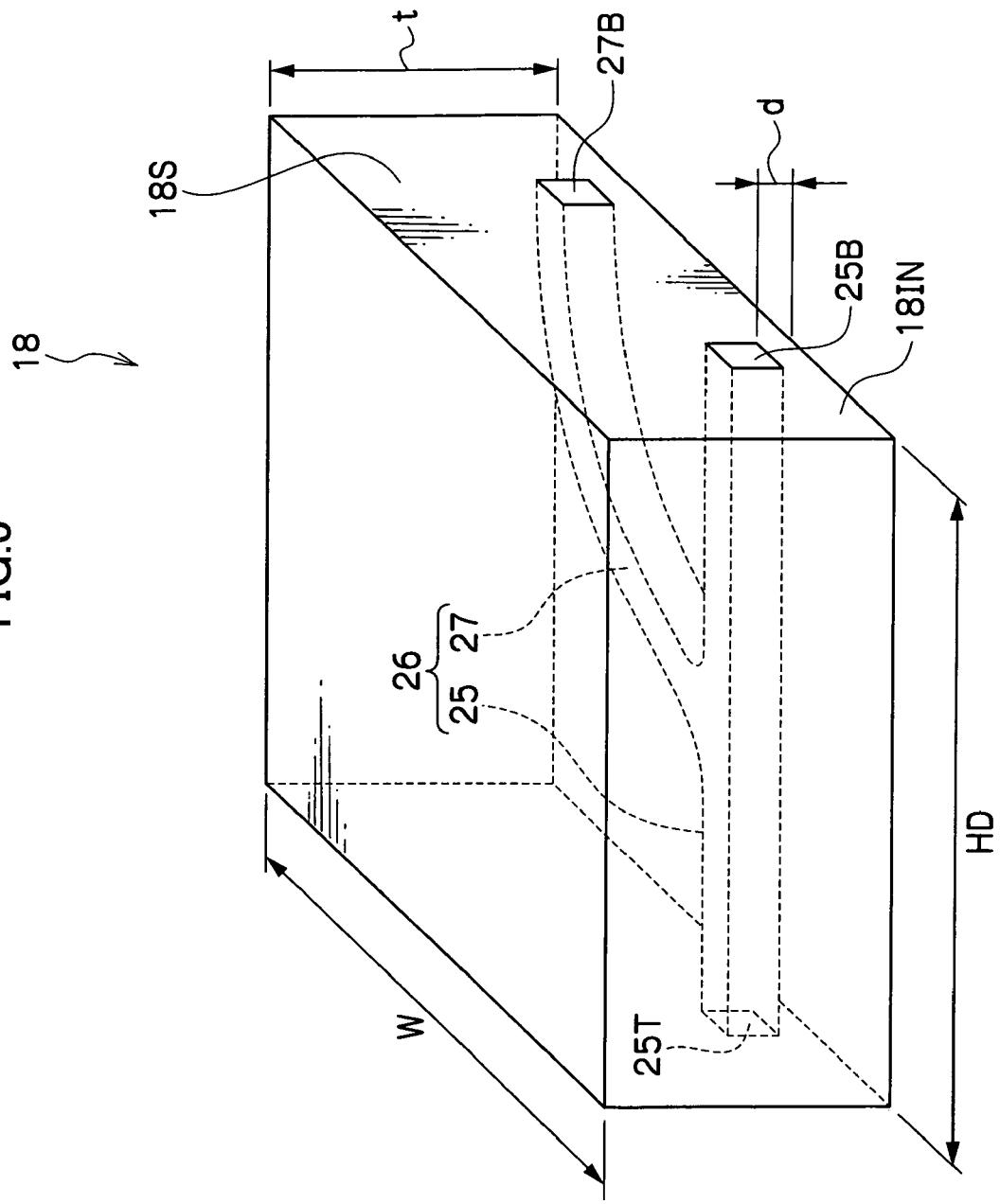
FIG. 5 is a perspective view of an optical waveguide constituting the optical transmission device of the first embodiment.

As shown in FIG. 5, the optical waveguide 18 has a light introducing portion 26 composed of core material. The light introducing portion 26 has a light introducing terminal 25T to be optically coupled with the optical fiber 16 through a lens 30 formed on a face (top face of FIGS. 1 and 2) of a lens 30 side of the optical waveguide 18. The light introducing portion 26 has a light receiving element side light introducing terminal 25B to be optically coupled with the light receiving element 14 and a light emitting element side light introducing terminal 27B to be coupled with the light emitting element 12, these terminals being provided on a bottom face 18S of the optical waveguide 18 which is a face on the side of the sub-mount 22.

The light introducing terminal 25T and the light receiving element side light introducing terminal 25B are continuous through the linear core portion 15 which constitutes the light introducing portion 26. A core branch portion 27 which constitutes the light introducing portion 26 is provided in the optical waveguide 18 and the core branch portion 27 is continuous from a midway of the linear core portion 25 to the light emitting element side light introducing terminal 27B.

Figure 7:
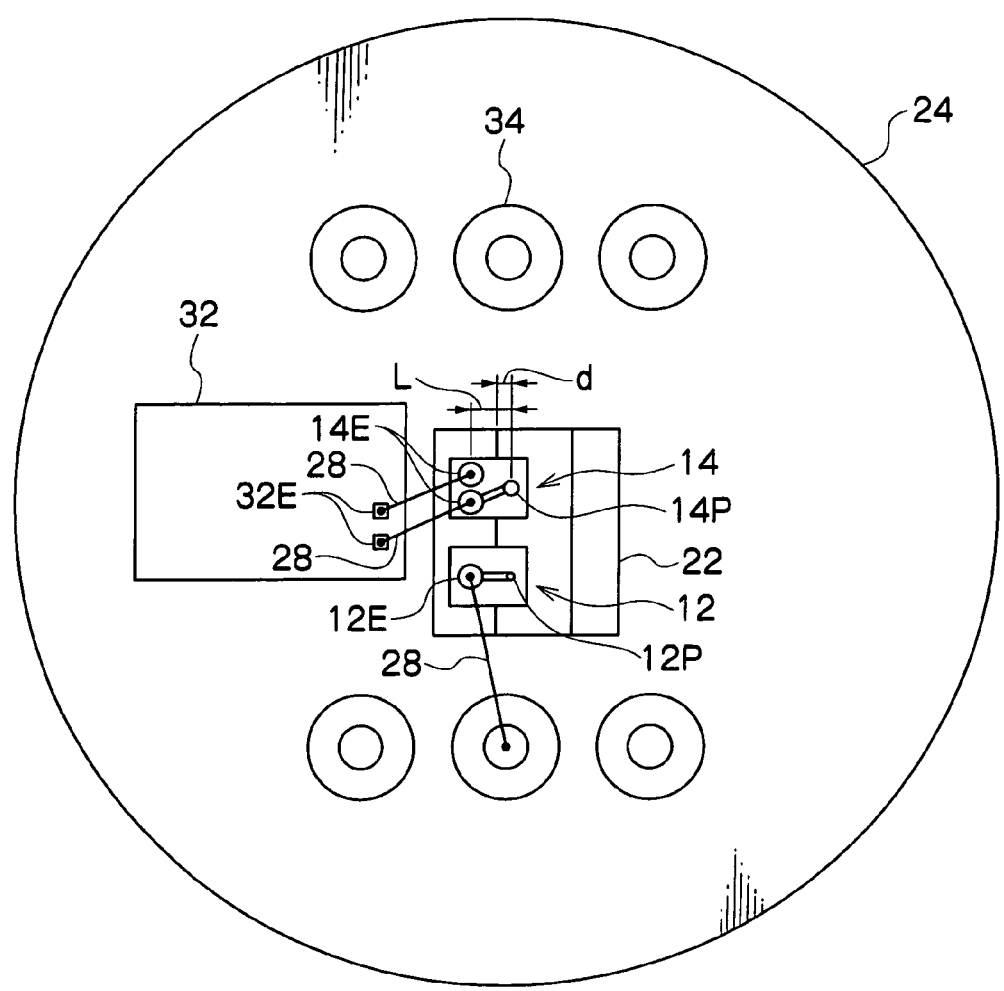
FIG. 7 is a plan view showing a condition in which the light emitting element and the light receiving element are to be connected with bonding wires according to the first embodiment.

According to this embodiment, as shown in FIG. 5, the thickness t of the optical waveguide 18 on the bottom face 18S thereof is about 300 µm and a distance d from a positioning side face 18IN on a side near the light introducing portion 26 to the light introducing portion 26 is about 50 µm. If the thickness t is too small, the optical waveguide 18 cannot be stood up vertically easily. If the distance d is too large, electrode portions of the light emitting element 12 and the light receiving element 14 are hidden thereby making it difficult to connect bonding wire. As shown in FIG. 7, preferably, a distance L in the thickness direction of the optical waveguide from a light receiving portion 14P of the light receiving element 14 up to an electrode portion 14E is about 100 µm and the distance d is 100 µm or less. The same thing can be said about a distance in the thickness direction of the optical waveguide from the light emitting portion 12P of the light emitting element 12 up to the electrode portion 14E.

Figure 6:
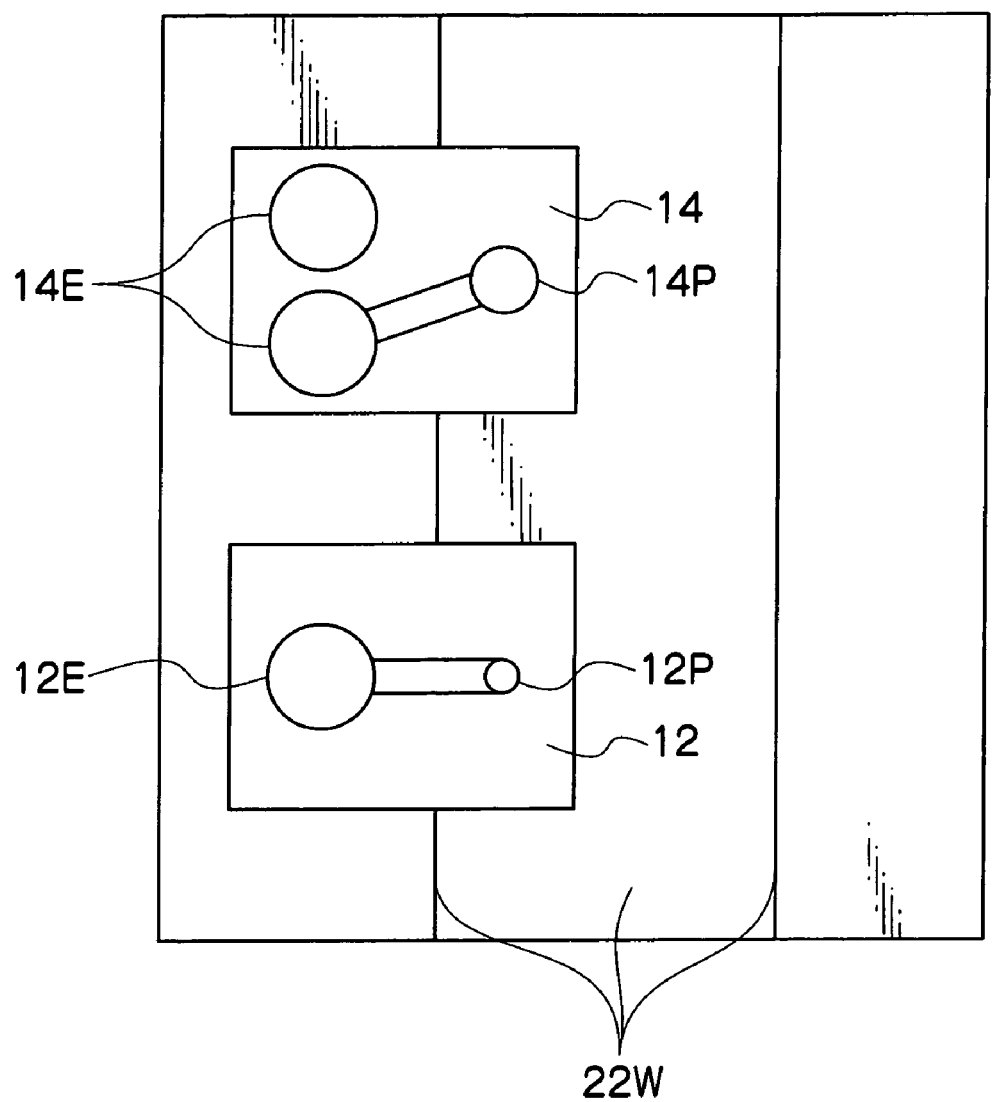
FIG. 6 is a plan view showing a condition in which a light emitting element and a light receiving element are positioned on a sub-mount according to the first embodiment.

When manufacturing an optical transmission module 11, as shown in FIG. 6, the light emitting element 12 and the light receiving element 14 are dropped into the light emitting element positioning portion 22H and the light receiving element positioning portion 22J in the sub-mount 22 respectively and fixed there so that they are aligned passively. After they are fixed to the base 24 together with the sub-mount 22, an electrode portion 12E of the light emitting element 12 and an electrode portion 14E of the light receiving element 14 are connected to an electrode 32E of an IC 32 and an electrode 34 with bonding wire 28 (see FIG. 1) as shown in FIG. 7.

Figure 8:
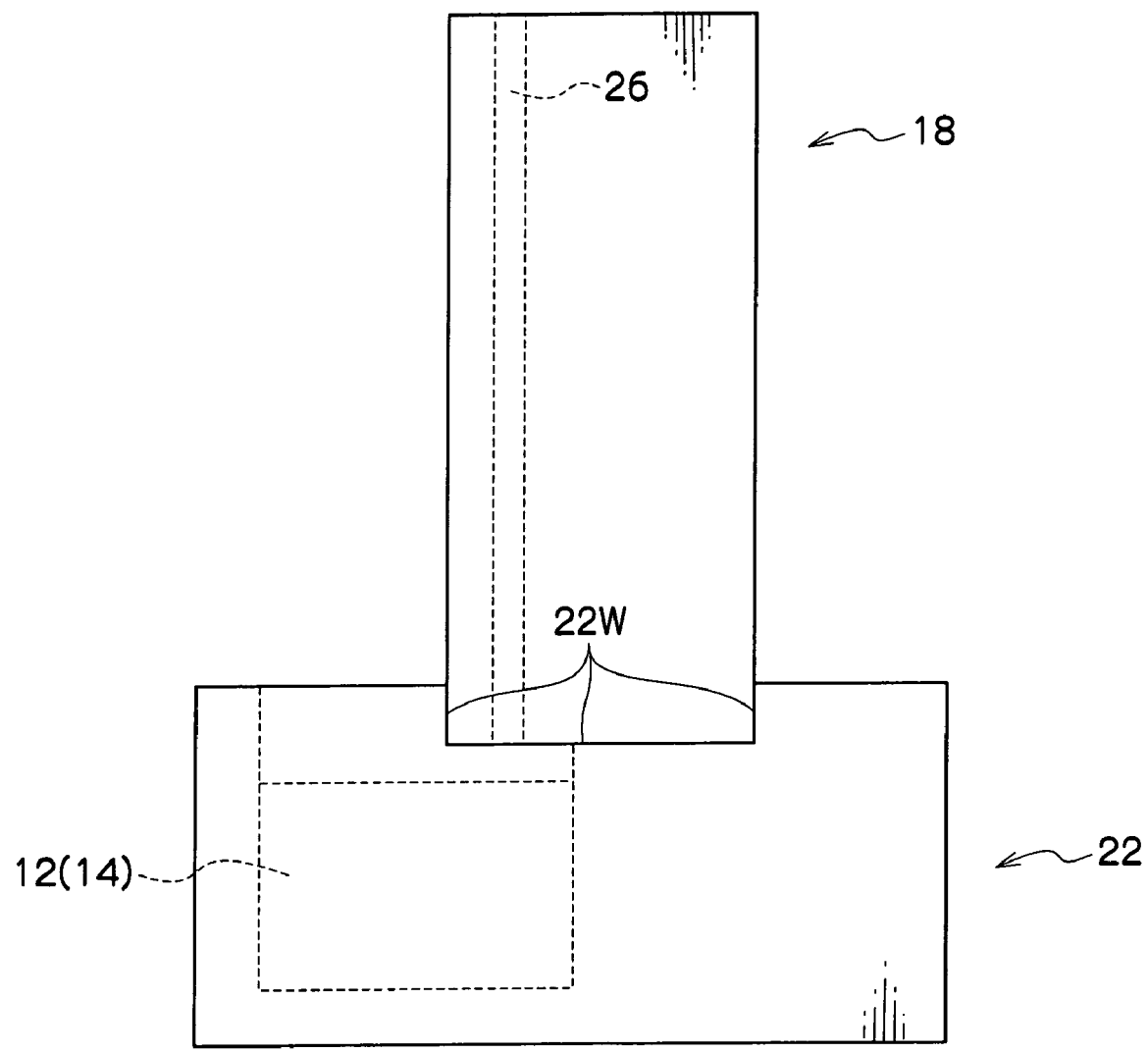
FIG. 8 is a side view showing a condition in which the optical waveguide is positioned to the sub-mount according to the first embodiment.
Figure 9:
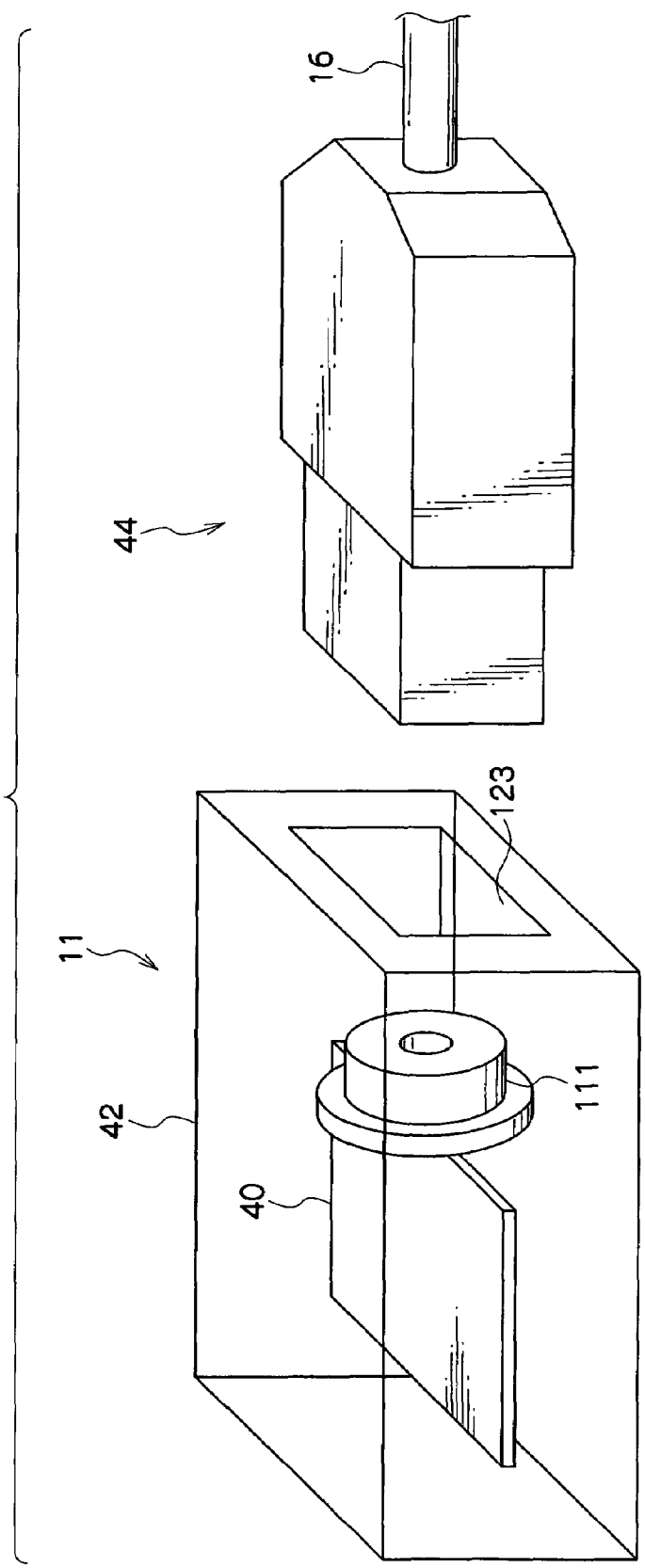
FIG. 9 is a perspective view showing a condition in which a plug connected to the optical fiber is to be inserted into the optical module of the first embodiment.

The position in the thickness direction of the optical waveguide 18 is specified passively by the optical waveguide positioning portion 22W in the sub-mount 22 (see FIG. 8). Positioning of the optical waveguide 18 in a direction perpendicular to the thickness direction is carried out by an active method of searching for a position in which the quantity of light passing through the optical waveguide 18 maximizes by activating the bonded light emitting element 12 to emit light.

Figure 2:
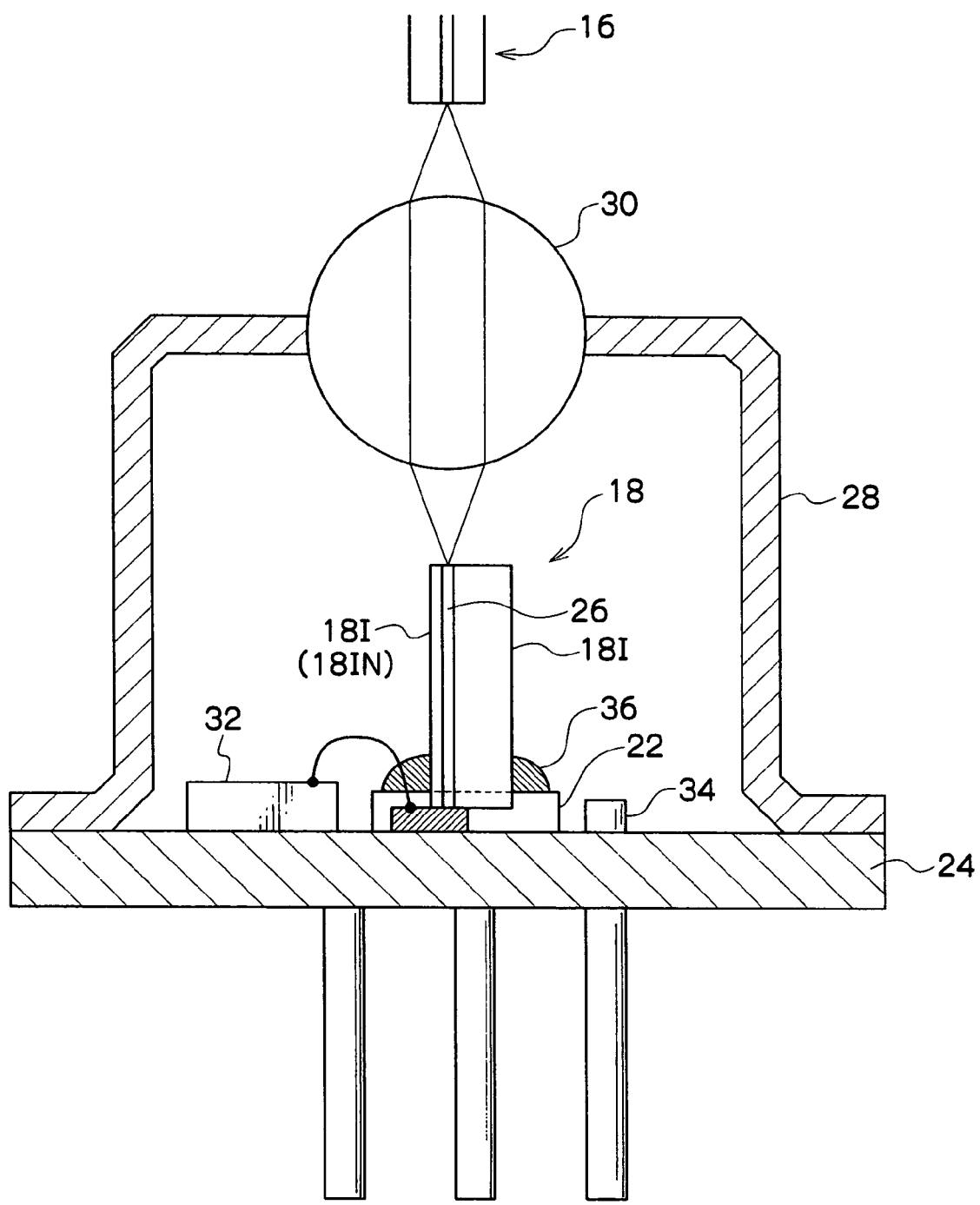
FIG. 2 is a side sectional view showing the structure of an optical transmission device according to a first embodiment, which is a side sectional view on a side perpendicular to FIG. 1.

Then, the optical waveguide 18 is fixed with fixing member such as ultraviolet curing resin (see FIG. 2). Further, by mounting a cap member 38 with a lens 30 on the base 24 and sealing it, an optical module 111 is manufactured such that it is formed in the configuration of a metallic package.

As a consequence, a 1-core, two-way optical module which is much smaller than a conventional type can be produced. The metallic can packaged optical module 111 manufactured in this way is mounted to an external circuit board 40 and accommodated in a receptacle case 42 having an optical fiber receptacle portion (optical transmission medium mounting portion) 123 so as to give a larger optical module 11. Then, the 1-core, two-way optical transmission element can be provided by inserting a plug 44 connected to the optical fiber 16 into the receptacle case 42.

In the meantime, this element may be used to send light into air or like space as an optical transmission medium instead of the optical fiber 16 or the optical waveguide 18 may be extended up to an opposing optical element so as to use the optical waveguide itself as an optical transmission medium.

The sub-mount 22 may be formed by molding as well as the manufacturing method according to this embodiment. The sub-mount 22 may be formed in a single unit or integrally with the base 24.

Although according to this embodiment, active positioning is executed for part of positioning of the optical waveguide 18, this may be carried out passively by changing the shape of the optical waveguide positioning portion 22W. As an active positioning method, it is permissible to position by using an alignment mark.

Example of First Embodiment

According to this embodiment, when manufacturing the optical waveguide 18, polymer optical waveguide film copied with a casting die is used. While the width of the optical waveguide 18 is not so highly accurate because it is determined by cutting, the distance d and the thickness t are highly accurate because they are determined by the thickness of film. Thus, the thickness t and the distance d can be used for forming the positioning portion.

Further, because cut-out with a dicer is easy and the thickness of the film can be selected, d and t can be adjusted easily. In the meantime, the optical waveguide 18 may be manufactured according to other manufacturing method.

According to this embodiment, VCSEL having a wavelength of 850 nm is used as the light emitting element and GaAs made PIN photodiode is used as the light receiving element. An amplifier element such as preamplifier is used as the IC.

According to this embodiment, the thickness t of the optical waveguide 18 is about 300 µm and the width W of the optical waveguide 18 is 1000 µm. The sub-mount width B along the thickness direction of the sub-mount is 90 µm. The height HS of the sub-mount is 500 µm and the height HD of the optical waveguide is 2000 µm.

This embodiment is employed to couple with refraction index distribution type glass multimode optical fiber having a core diameter of 50 µm and the sectional shape of a light introducing portion of the optical waveguide is 45 µm square. By using such an optical waveguide, excellent optical coupling characteristic is obtained using a cheap same-magnification optical system.

Second Embodiment

Figure 10A:
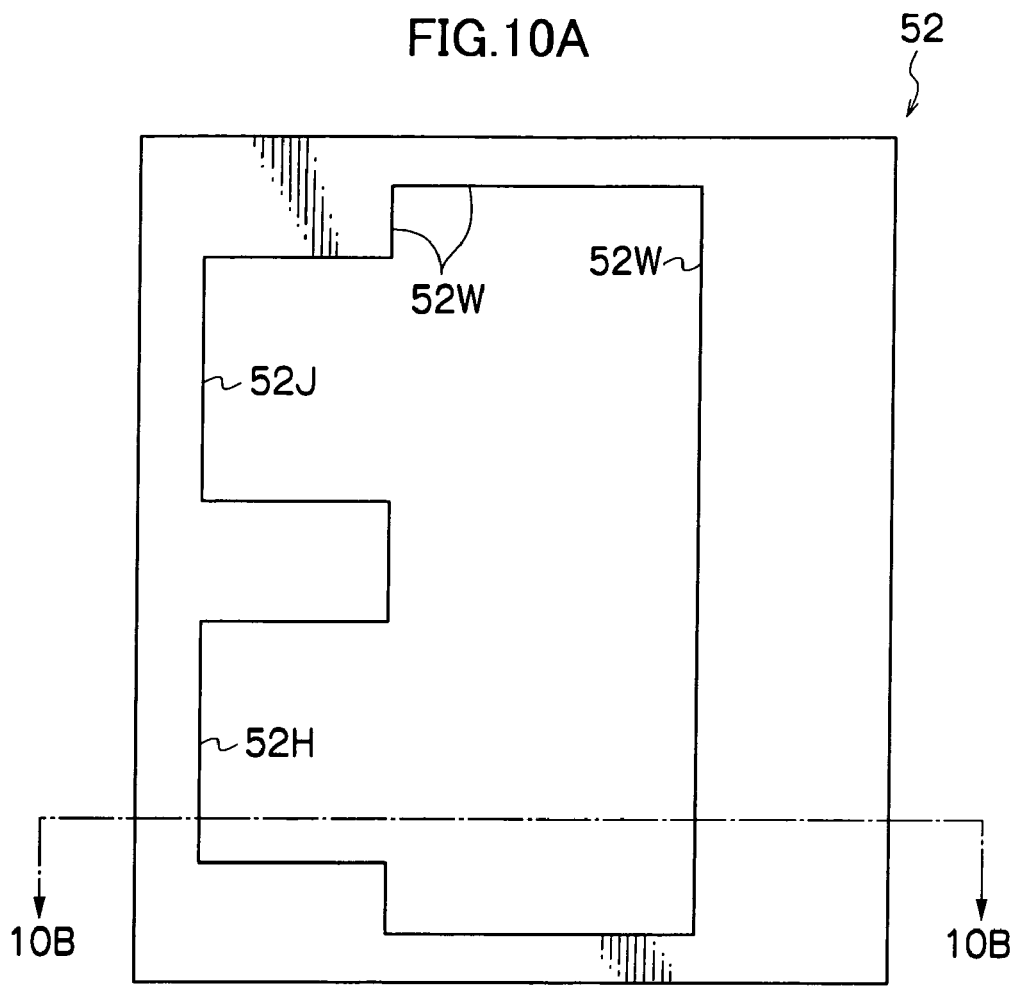
FIGS. 10A and 10B are respectively a plan view showing a sub-mount constituting the optical transmission device and optical module of the second embodiment and a side sectional view taken along the line 10B-10B.
Figure 10B:
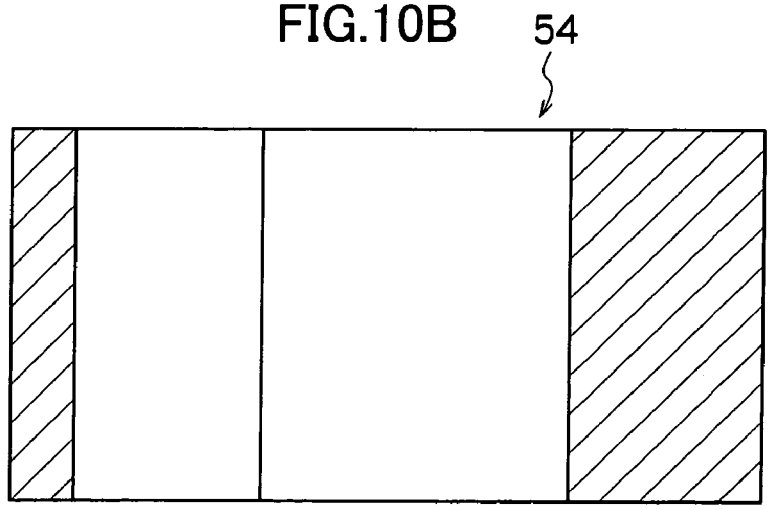
Figure 11A:
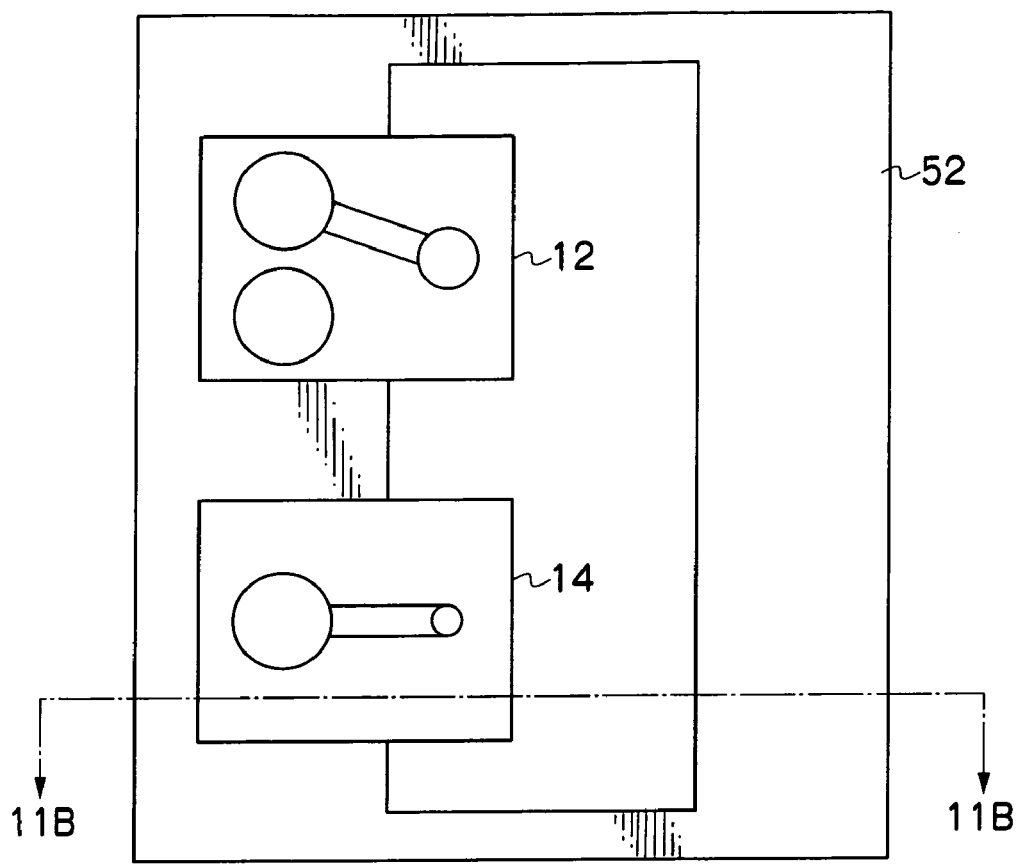
FIGS. 11A and 11B are respectively a plan view showing a condition in which the light emitting element and the light receiving element are positioned on the sub-mount according to the second embodiment and a side sectional view taken along the line 11B-11B respectively.
Figure 11B:
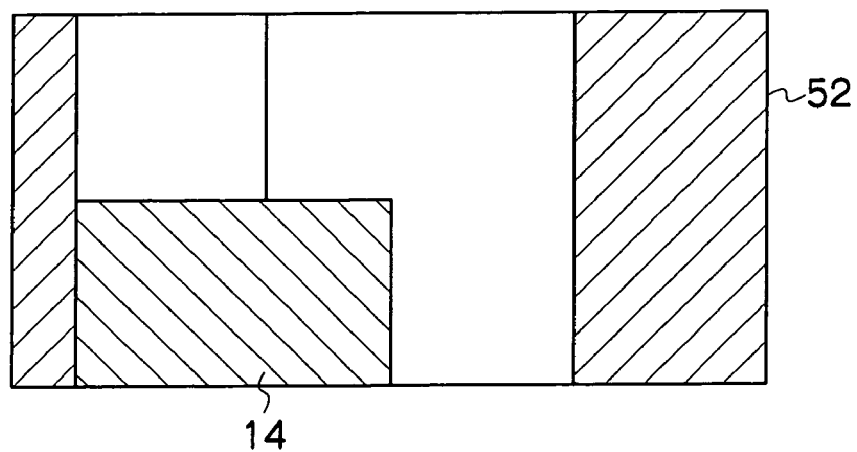
Figure 12:
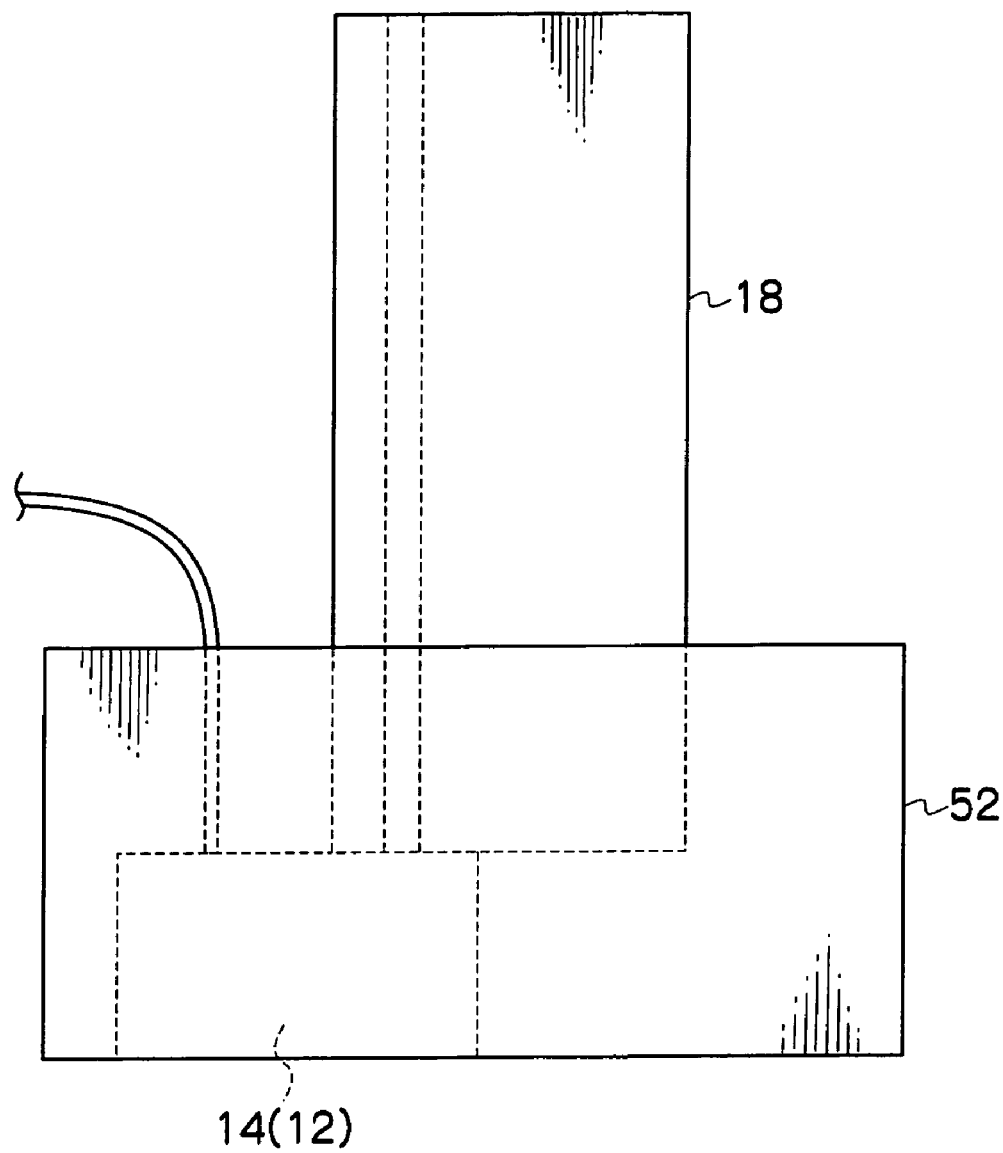
FIG. 12 is a side view showing a condition in which the optical waveguide is positioned according to the second embodiment.

Next, the second embodiment of the invention will be described. As shown in FIGS. 10A and B through 12, the optical transmission device of this embodiment includes a sub-mount 52 instead of the sub-mount 22 as compared with the first embodiment.

A through hole 54 is formed by processing this sub-mount 52 by one-stage drilling with reactive ion etching (RIE). A light emitting element positioning portion 52H, a light receiving element positioning portion 52J and an optical waveguide positioning portion 52W are formed on the wall face of the through hole 54.

After the light emitting element 12 and the light receiving element 14 are set in the through hole 54, they are positioned by bringing them into a contact with the light emitting element positioning portion 52H and the light receiving element positioning portion 52J.

After the light emitting element 12 and the light receiving element 14 are wire-bonded, the optical waveguide 18 is inserted into the through hole 54 and positioned by bringing it into a contact with the optical waveguide positioning portion 52W. The vertical positioning of the optical waveguide 18 is automatically performed by bringing the optical waveguide 18 into a contact with the light emitting element 12 and the light receiving element 14.

According to this embodiment, the manufacturing cost of the sub-mount 52 is reduced.

Third Embodiment

Figure 13:
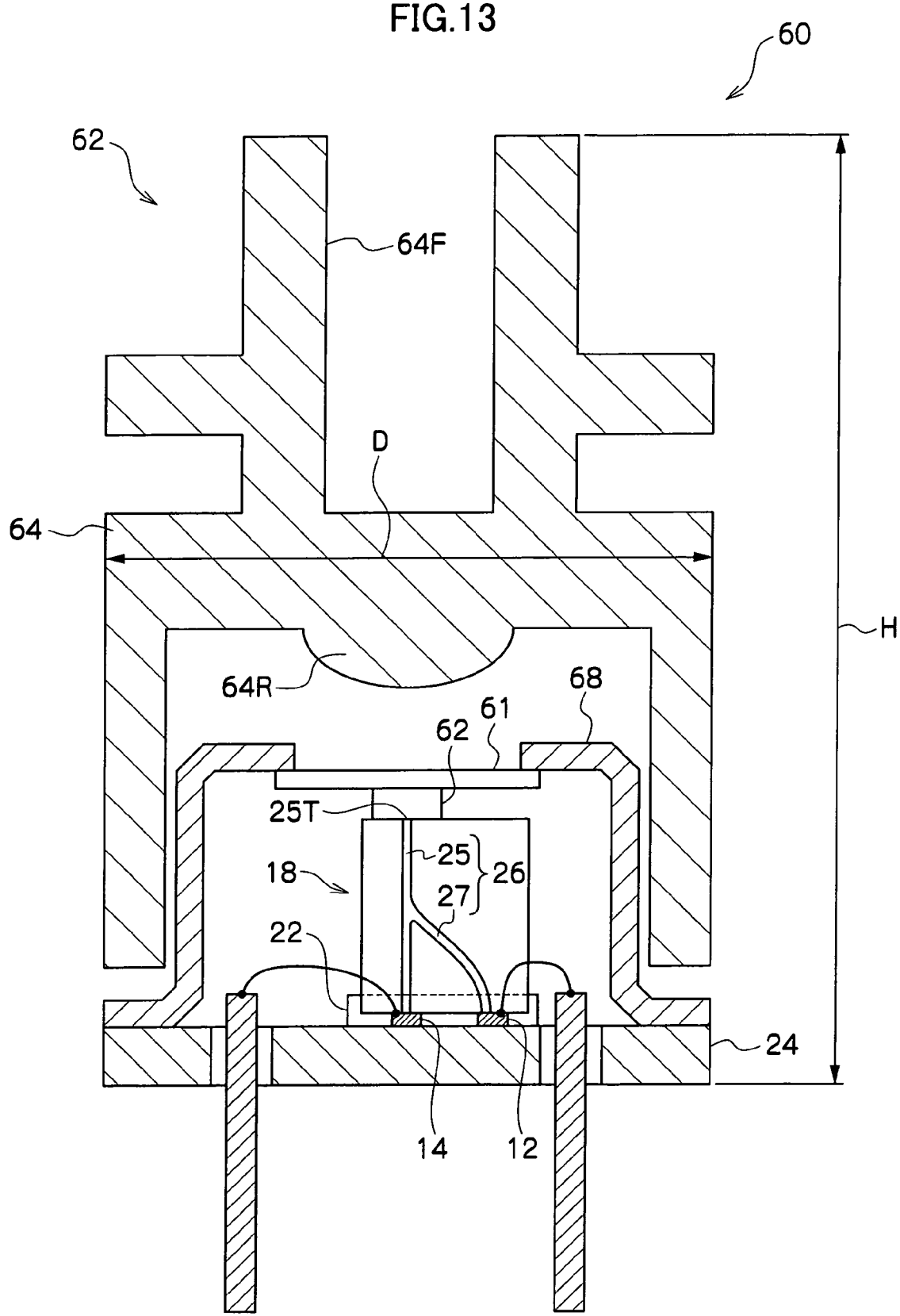
FIG. 13 is a side sectional view showing the structure of an optical module according to a third embodiment.

Next, the third embodiment will be described. As shown in FIG. 13, an optical module 60 of this embodiment is provided with a flat transparent glass 61 as a cover glass instead of the lens 30 as compared with the first embodiment. The transparent glass 61 is mounted on a cap member 68 mounted on the base 24 and a zone in which the optical waveguide 18 is provided is sealed by the cap member 68, the transparent glass 61 and the base 24. Matching gel 62 is provided between the transparent glass 61 and a light introducing terminal 25T in contact conditions.

Further according to this embodiment, a transparent sleeve 64 is fitted to the outside of the side wall of the cap member 68.

If the sleeve 64 is fitted to a predetermined position of the cap member 68, a lens portion 64R is formed so that the focal point coincides with the light introducing terminal 25T of the light introducing portion 26. An insertion portion (optical transmission medium mounting portion) in which the optical fiber is to be inserted is formed in the sleeve 64.

As an example, the height H from the base 24 to the front end of the sleeve 64 is 12.4 mm and the outside diameter D of the sleeve 64 is 6.6 mm.

According to this embodiment, no lens needs to be attached to the cap member 68 thereby reducing the quantity of components, manufacturing time and manufacturing cost.

Fourth Embodiment

Figure 14:
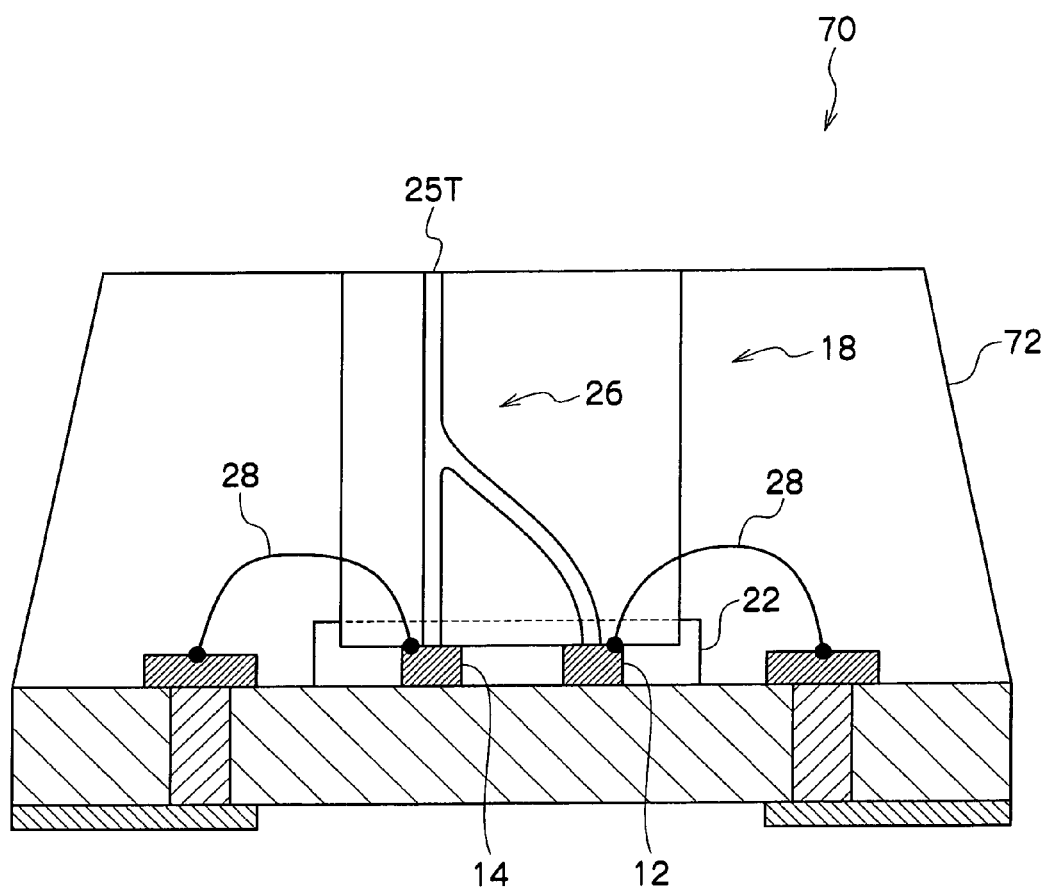
FIG. 14 is a side sectional view showing the structure of an optical module according to a fourth embodiment.

Next, the fourth embodiment of the invention will be described. In the optical module 70 of this embodiment, as shown in FIG. 14, the optical waveguide 18, the sub-mount 22, electrodes connected by wire bonding 28 and the like are sealed with resin member 72 such that the light introducing terminal 25T of the optical waveguide 18 is exposed.

As a consequence, reduction in cost can be achieved.

Figure 15:
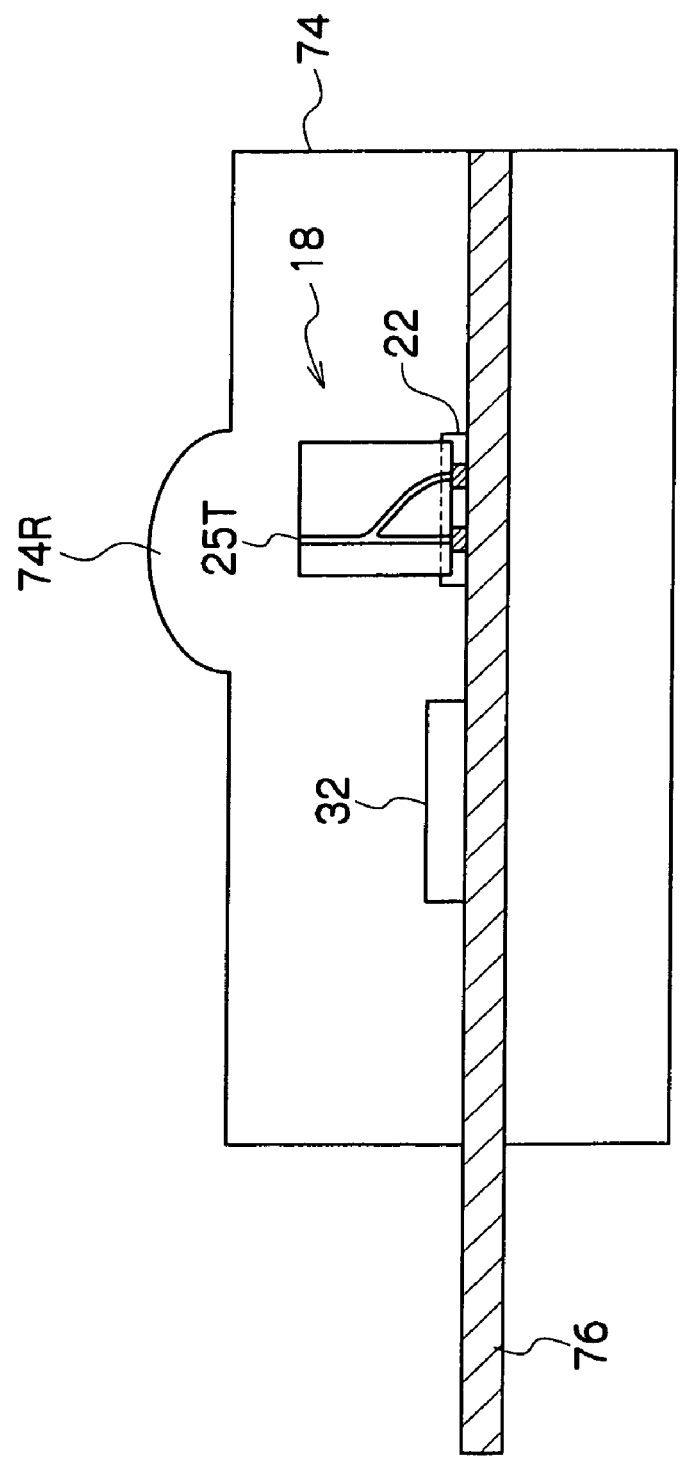
FIG. 15 is a side sectional view showing the structure of a modification of an optical module according to the fourth embodiment.

It is permissible to seal the light introducing terminal 25T with resin and use a transparent resin member 74 in which a lens portion 74R focusing on the light introduction terminal 25T is formed as shown in FIG. 15. As a consequence, further reduction in the quantity of components and manufacturing cost can be achieved. Further, it is permissible to attach the IC 32 and the sub-mount 22 to a lead frame 76 and seal the optical waveguide 18 and the IC 32 together with the lead frame with resin.

Fifth Embodiment

Next, the fifth embodiment will be described. As shown in FIGS. 16 through 19A and B, the optical module 80 (see FIGS. 18A, B and 19A, B) of this embodiment comprises a surface-type first light emitting element 82 and a second light emitting element 83 having light emitting faces 82L, 83L respectively on the back of its mounting face. The mounting faces of the first light emitting element 82 and the second light emitting face 83 are located within the same plane. According to this embodiment, the wavelength of lights emitted by the first light emitting element 82 and the second light emitting element 83 are different from each other.

The optical transmission device 80 includes an optical waveguide 88 which optically couples the first light emitting element 82 and the second light emitting element 83 with optical fiber disposed substantially in the direction of normal line of the mounting faces of the first light emitting element 82 and the second light emitting element 83, a sub-mount 84 equipped with the first light emitting element 82, the second light emitting element 83 and the optical waveguide 88 and a base 85 for fixing the sub-mount 84 at a predetermined position.

The sub-mount 84 includes a positioning portion for respectively positioning the first light emitting element 82, the second light emitting element 83 and the optical waveguide 88 similar to the first embodiment.

Figure 16:
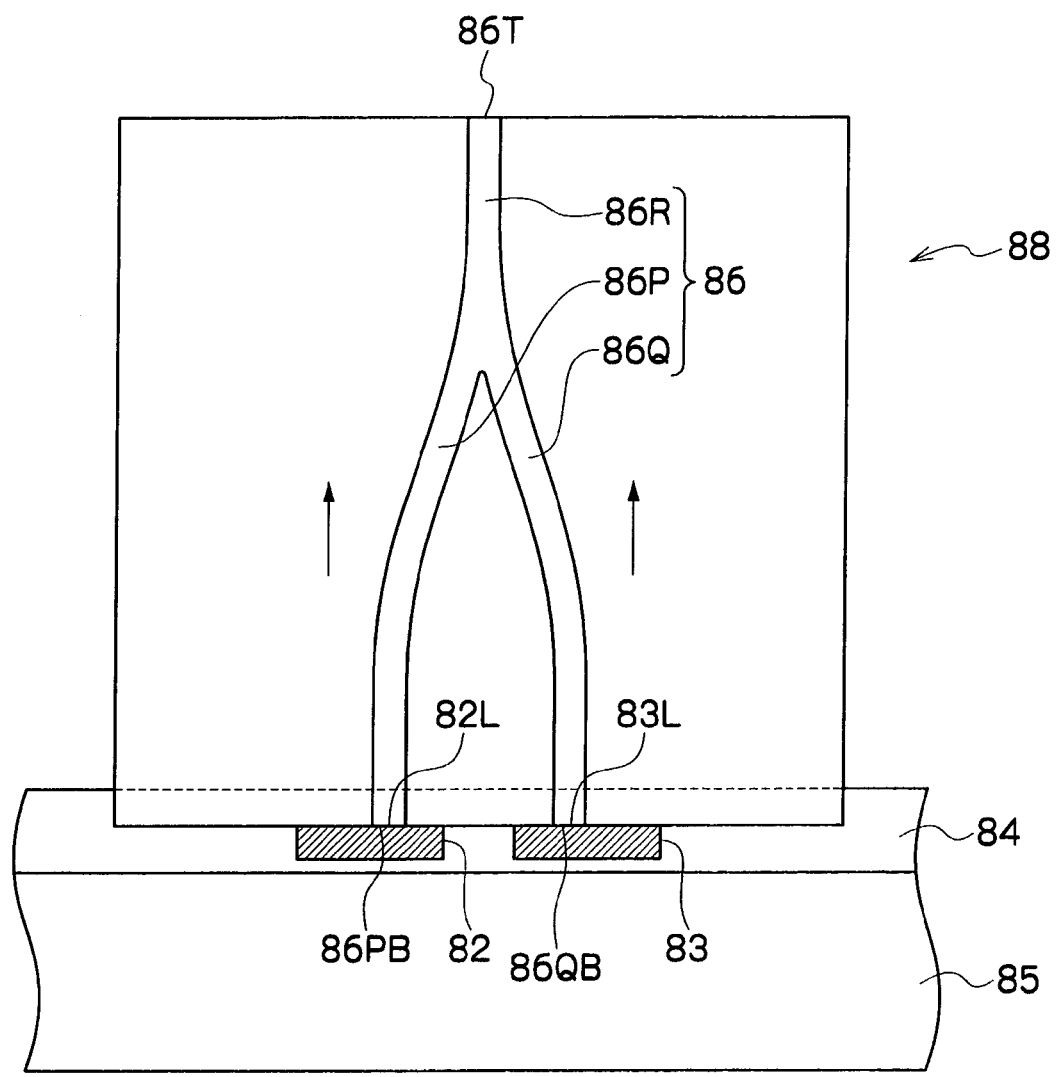
FIG. 16 is a side sectional view showing the structure of an optical transmission device and optical module according to a fifth embodiment.
Figure 17:
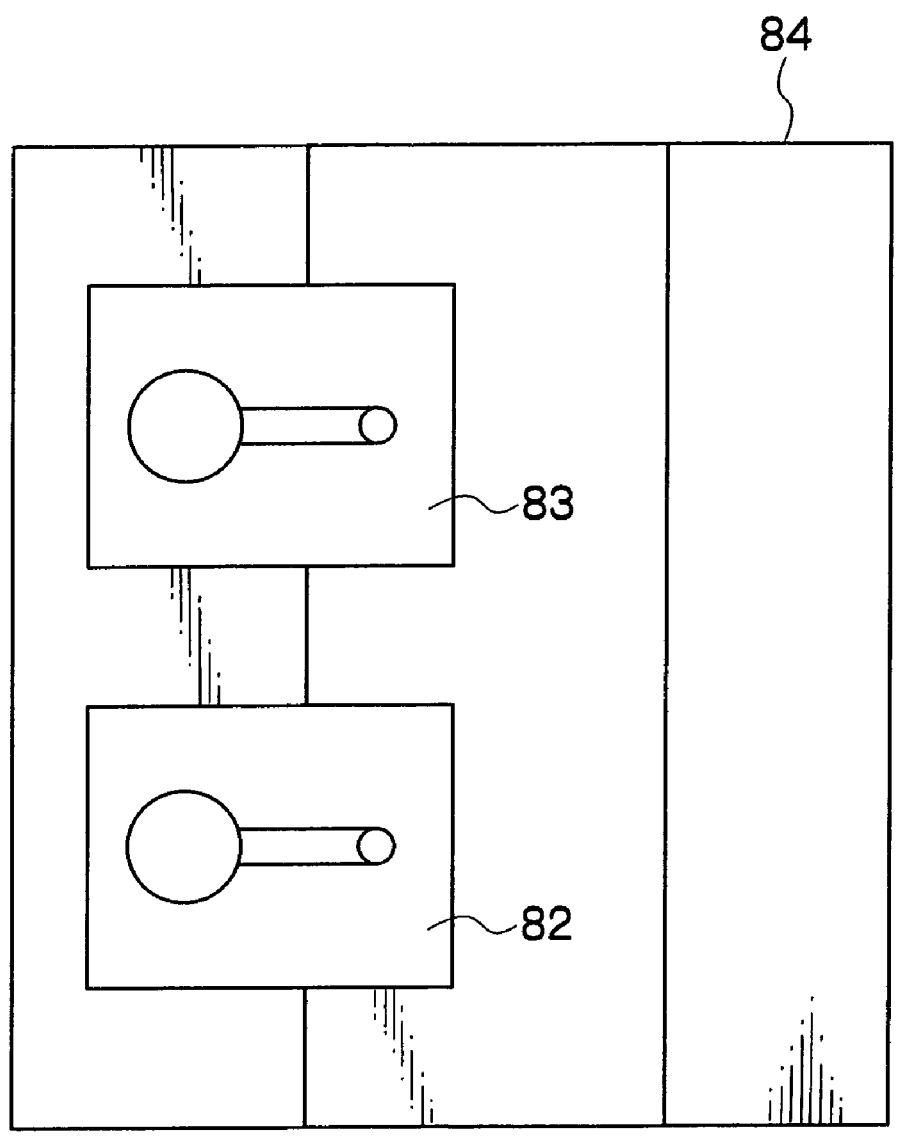
FIG. 17 is a plan view showing a condition in which the first light emitting element and second light emitting element are positioned to a sub-mount according to the fifth embodiment.
Figure 18A:
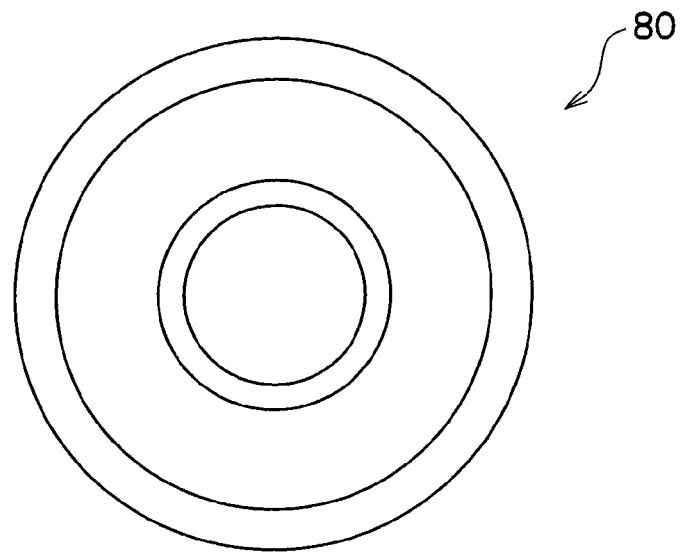
FIGS. 18A and 18B are respectively a plan view and a side view of the optical module according to the fifth embodiment.
Figure 18B:
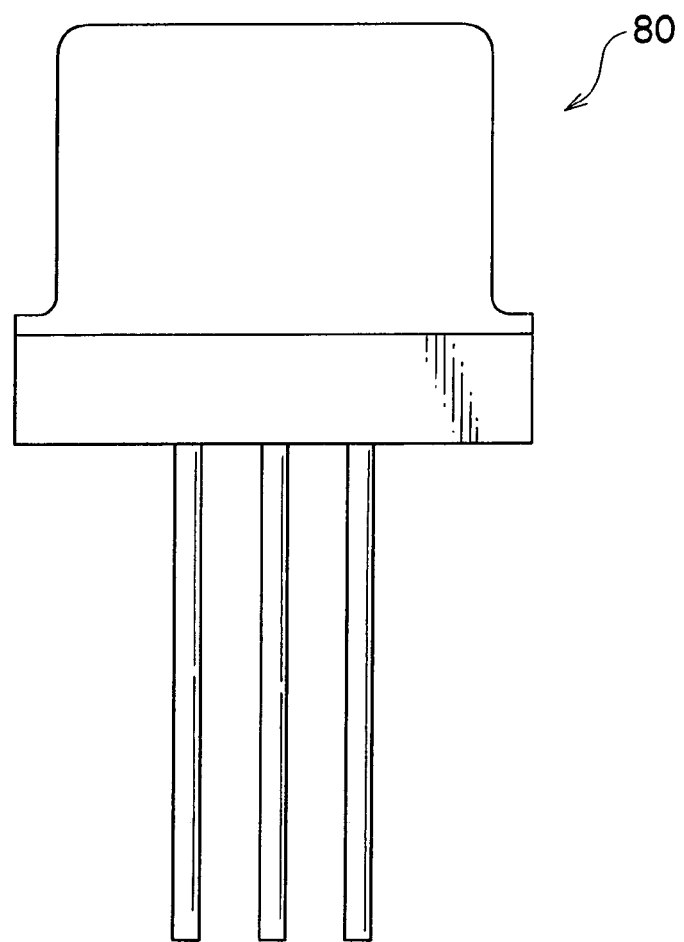
Figure 19A:
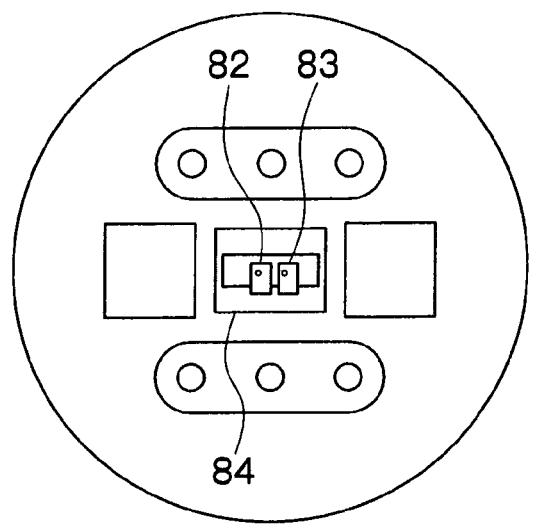
FIGS. 19A and 19B are respectively a plan sectional view and a side sectional view of the optical module according to the fifth embodiment.
Figure 19B:
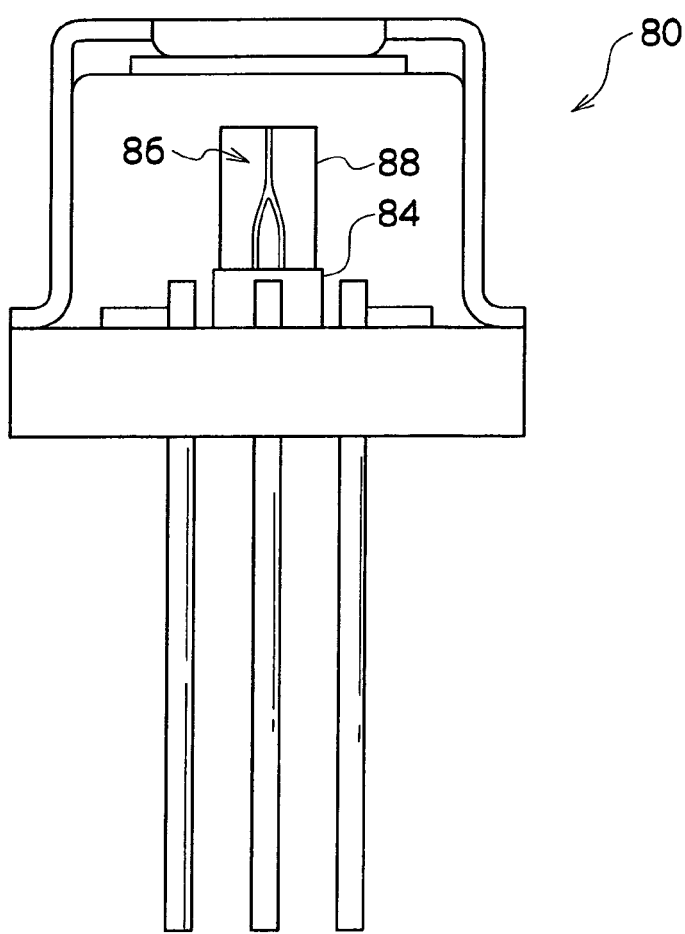

As shown in FIG. 16, the optical waveguide 88 includes a light introducing portion 86 composed of core material. The light introducing portion 86 has a light introducing terminal 86T which is to be coupled with an optical fiber optically through a lens on a face on the light emitting side (top face in FIG. 16). The light introducing portion 86 has a first light introducing terminal 86PB to be coupled optically with the first light emitting element 82 and a second light introducing terminal 86QB to be coupled optically with the second light emitting element 83, these terminals being provided on the bottom face which is a face on the side of the sub-mount 84.

The light introducing portion 86 includes a first light introducing portion 86P extending from the first light introducing terminal 86PB and a second light introducing portion 86Q extending from the second light introducing terminal 86QB. The first light introducing portion 86P and the second light introducing portion 86Q joins each other within the optical waveguide 88 so that they are continuous to each other. The light introducing portion 86 has a confluent light introducing portion 86R which extends from the light introducing terminal 86T downward with respect to FIG. 16 and is continuous to the first light introducing portion 86P and the second light introducing portion 86Q.

According to this embodiment, the first light emitting element 82 and second light emitting element 83 which emit lights each having a different wavelength can be provided in the sub-mount 84. Therefore, two-wave mixing optical transmission device 80 in which an optical waveguide is disposed highly accurately in a vertical direction to the mounting face of the surface-type light emitting element can be realized.

Figure 20:
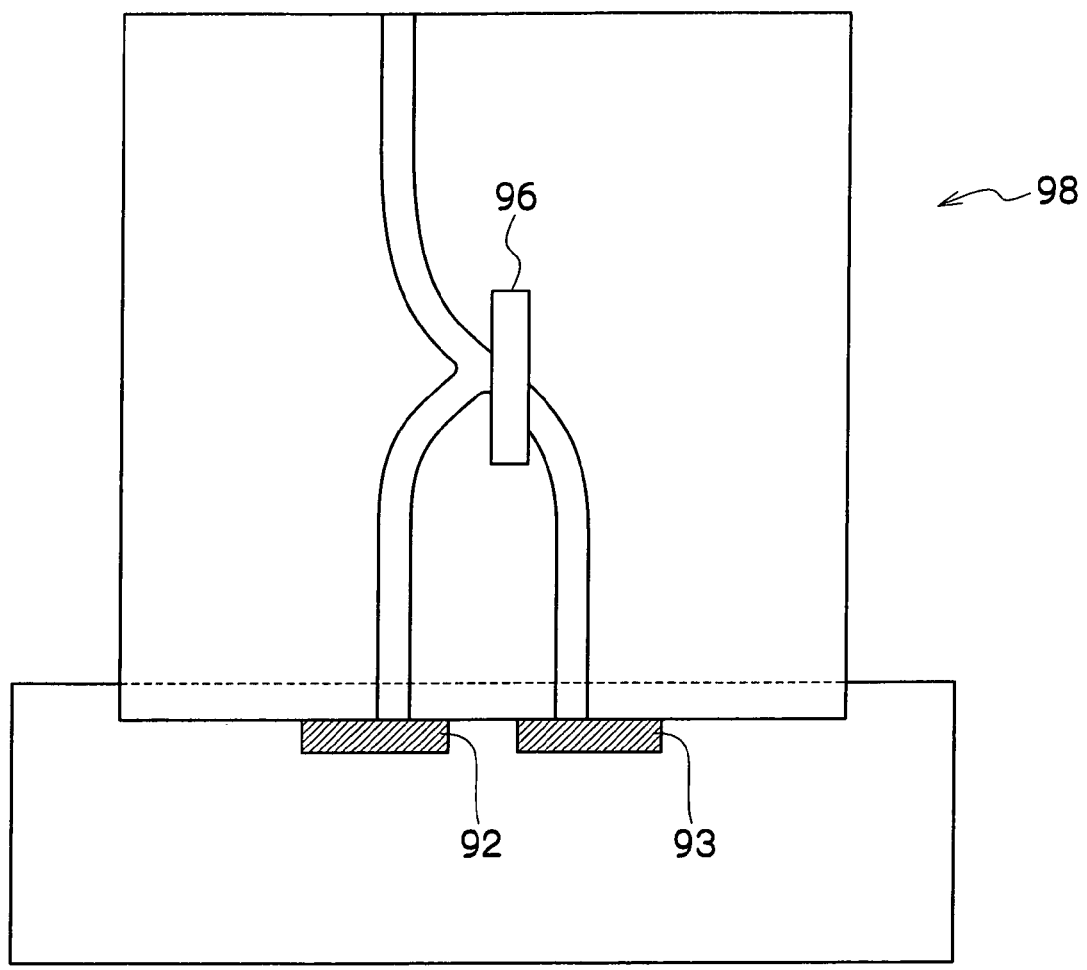
FIG. 20 is a side sectional view showing the structure of a modification of the optical transmission device and optical module according to the fifth embodiment.
Figure 21:
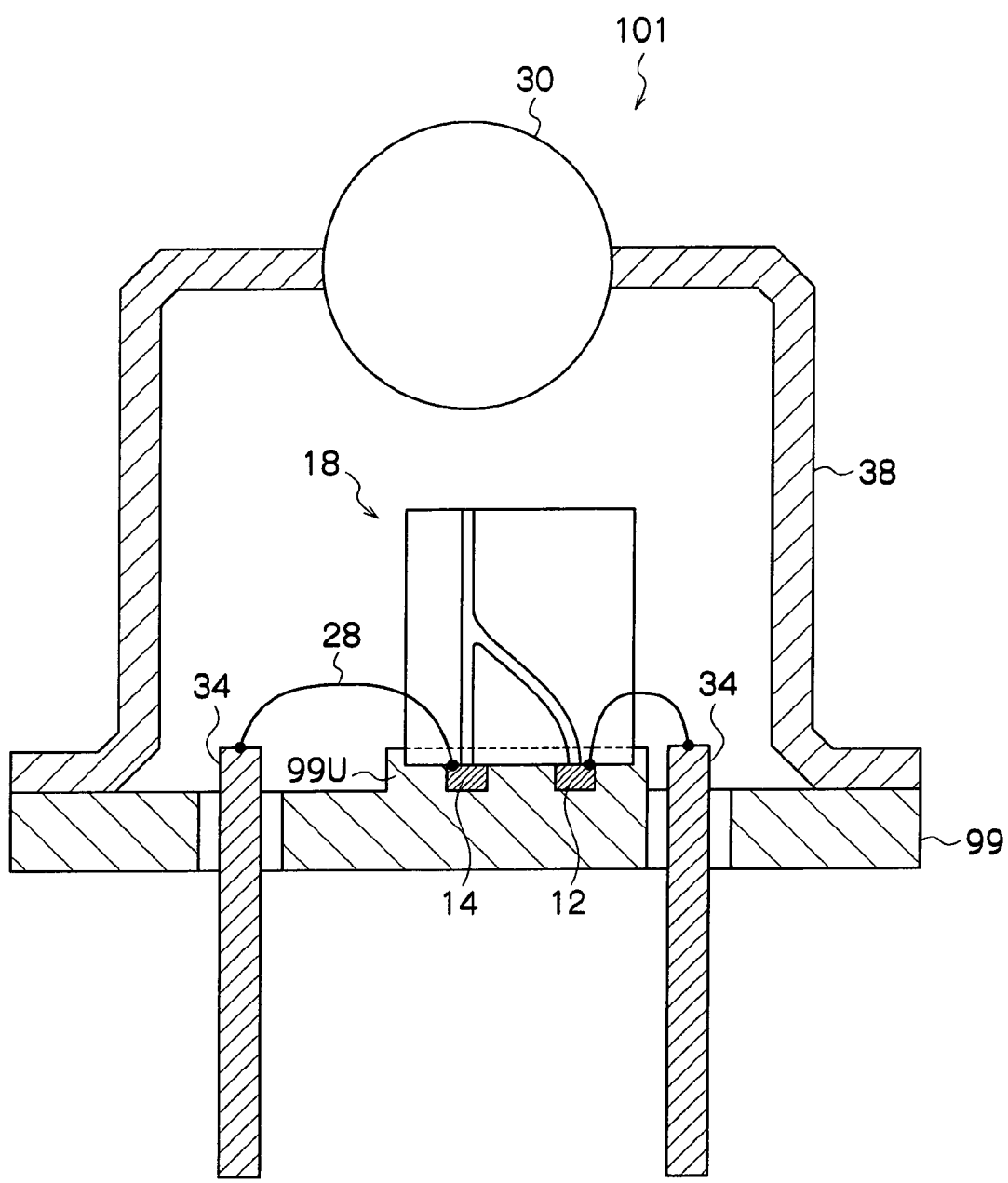
FIG. 21 is a side sectional view showing the structure of the optical transmission device and optical module according to the sixth embodiment.

By providing a first light receiving element 92 and a second light receiving element 93 instead of the first light emitting element 82 and the second light emitting element 83 and providing a light receiving optical waveguide 98 having the same shape and the same wavelength separating function as the optical waveguide 88 instead of the optical waveguide 88 as shown in FIG. 20, the two-wave separating optical transmission device for light receiving can be realized. It is easy to include a wavelength separating function by providing with, for example, a wavelength filter 96.

Sixth Embodiment

Next, the sixth embodiment of the invention will be described. The optical module 101 of this embodiment includes a base 99 instead of the base 24 and the sub-mount 22 as compared with the optical module 11 of the first embodiment.

The base 99 has and a contoured portion 99U integrally formed thereon for positioning the light emitting element 12, the light receiving element 14 and the optical waveguide 18.

The base 99 is a member formed with a mold and can be obtained by processing a ceramic member.

This embodiment eliminates the necessity of the sub-mount thereby reducing the quantity of components.

Seventh Embodiment

Figure 22:
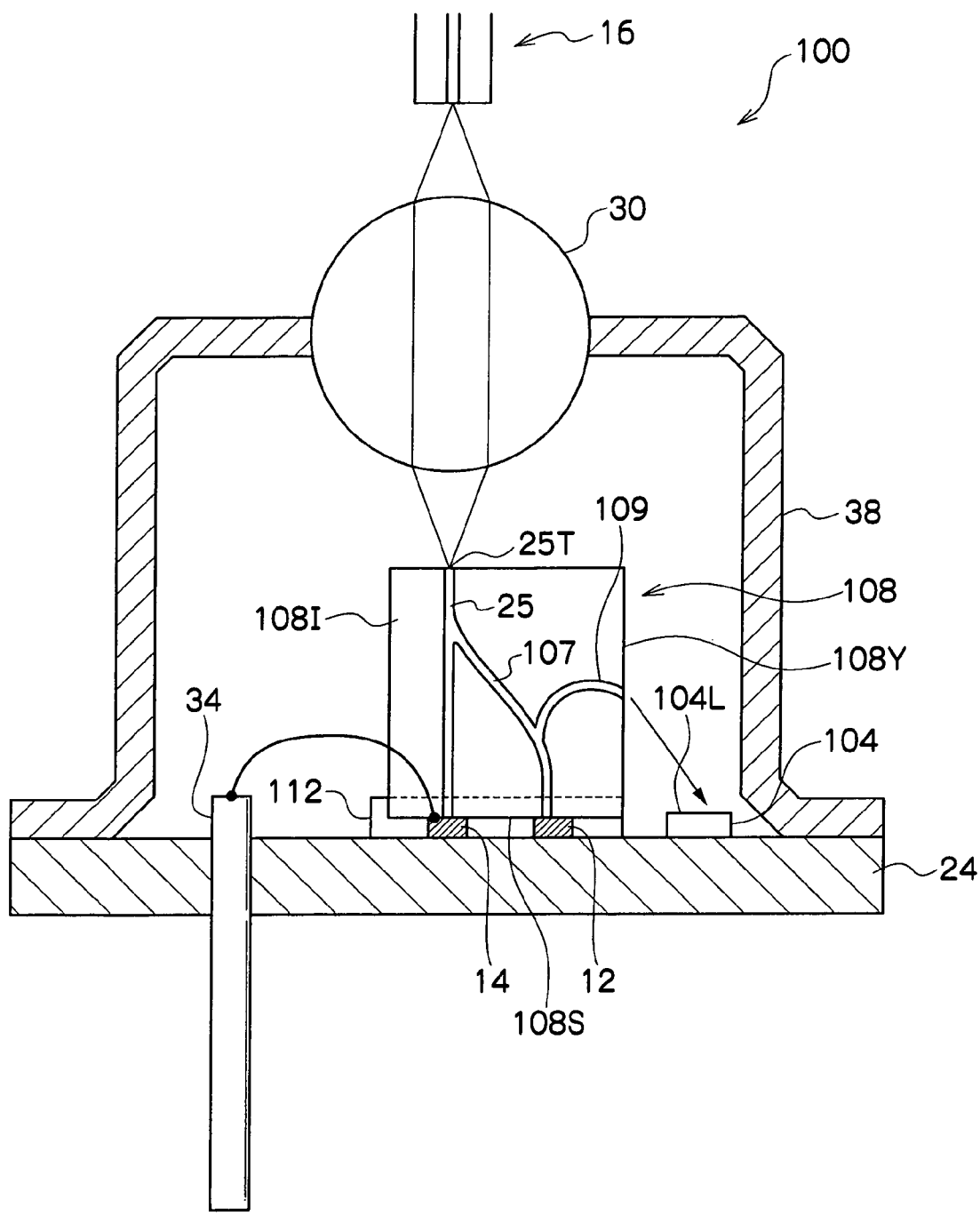
FIG. 22 is a side sectional view showing the structure of the optical transmission device of the seventh embodiment, which is a sectional view taken along the line 22-22 of FIG. 23.
Figure 23:
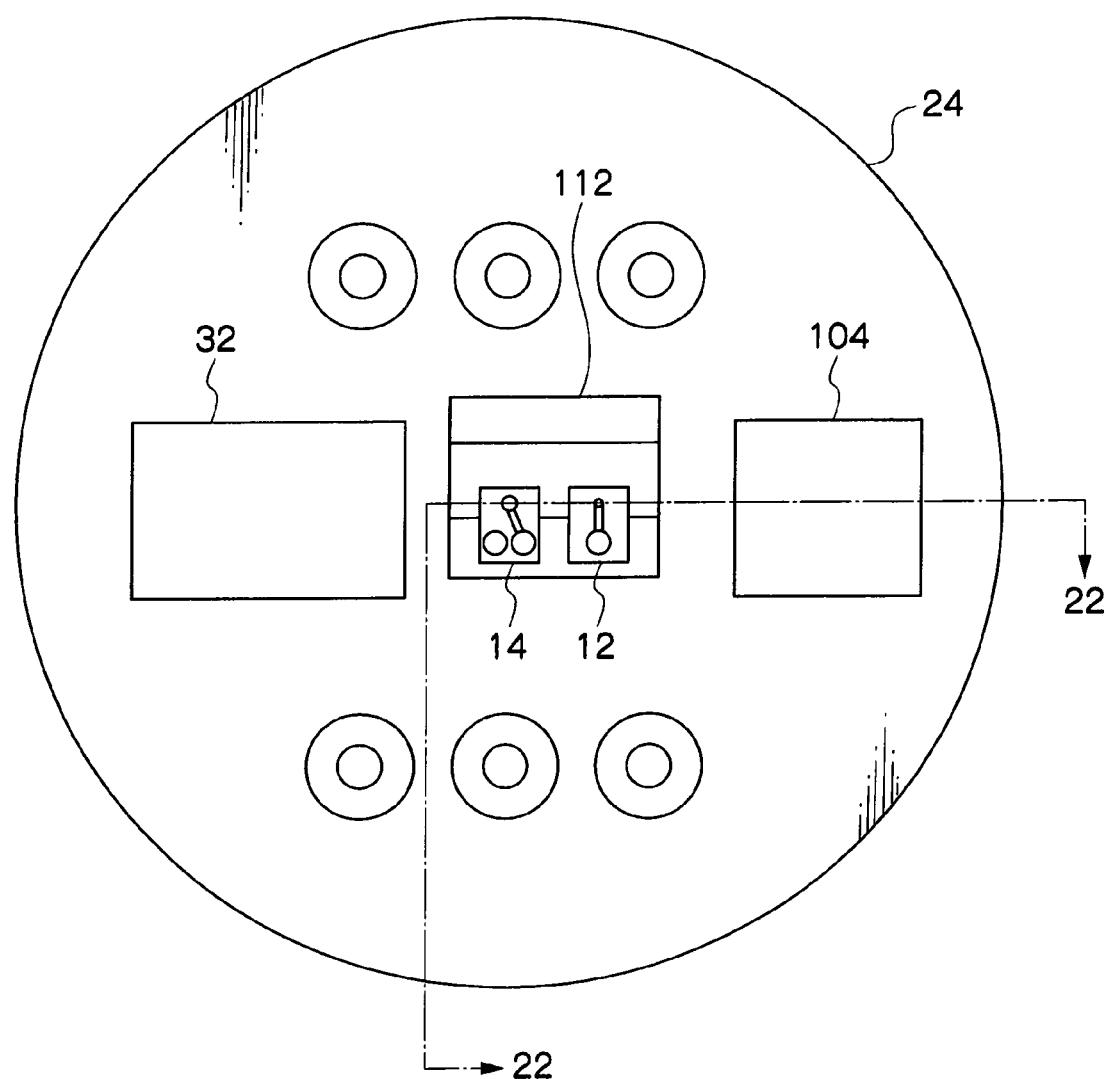
FIG. 23 is a plan view showing a condition in which the light emitting element and light receiving element are positioned to the sub-mount according to the seventh embodiment.

Next, the seventh embodiment will be described. As shown in FIGS. 22 and 23, the optical transmission device 100 of this embodiment includes an optical waveguide 108 instead of the optical waveguide 18 as compared with the first embodiment. Further, this embodiment includes a sub-mount 112 instead of the sub-mount 22.

The optical waveguide 108 includes an a core branch portion 107 similar to a core branch portion 27. Further, the optical waveguide 108 has a branch core portion 109 (see FIG. 22) which is branched from the core branch portion 107 in order to transmit part of light from the light emitting element 12 as a light attenuating portion.

The front end of the branch core portion 109 is located on a narrow side face portion 108Y which is parallel to the thickness direction of the optical waveguide 108 and perpendicular to the bottom face 108S of the optical waveguide 108 and exposed such that it is directed slightly downward. Then, the optical transmission device 100 includes a monitoring light receiving element 104 for monitoring the quantity of light emitted from the light emitting element 12 by receiving light irradiated from the front end of the branch core portion 109, the monitoring light receiving element being mounted on the base 24.

When emitting light from the light emitting element 12, it needs to be activated at an output higher than a predetermined output in order to emit stable light having an excellent waveform. From the viewpoint of the safety, the quantity of light emitted from the optical transmission device needs to be smaller than the aforementioned predetermined output.

This embodiment includes the branch core portion 109 which introduces part of light emitted from the light emitting element 12 so as to reduce the quantity of light emitted from the light introducing terminal 25T on the upper side with respect to this paper. Therefore, the optical transmission device can emit light which satisfies a requirement for the safety of laser with an excellent waveform. This exerts a large effect when driving the light emitting element 12 at high speeds.

Provision of the branch core portion 109 as the light attenuating portion enables to control the quantity of light at high precision.

Because this embodiment blocks light from the light emitting element 12 from impinging upon the branch core portion 109 directly, changes in the attenuating quantity can be suppressed when the light emitting element 12 is deflected from the position of the optical waveguide 108.

Light emitted from the branch core portion 109 impinges upon the monitoring light receiving element 104. Therefore, the quantity of light of the light emitting element 12, that is, the quantity of light emitted from the light introducing terminal 25T can be always monitored. Light entering the branch core portion 109 may be introduced to the monitoring light receiving element 104 or may be introduced not to be come out of the optical transmission device or absorbed.

Because the monitoring light receiving element 104 is provided on the base 24, its light receiving face 104L is in parallel to the base 24 and perpendicular to a positioning side face 108I of the optical waveguide 108. As a consequence, the monitoring light receiving element 104 can be disposed easily and the quantity of light to be projected to the monitoring light receiving element 104 can be controlled easily.

Although the branch core portion 109 may be elongated to introduce all of light emitted from the branch core portion 109 to the monitoring light receiving element 104, the optical waveguide 108 may be formed smaller in case of irradiating light into space as indicated in this embodiment and further, the quantity of light is easy to control when the quantity of light impinging upon the monitoring light receiving element 104 is too large. Further, variation of the quantity of received light due to deflection of the position of the monitoring light receiving element 104 is small.

Example of the Seventh Embodiment

This embodiment is provided with VCSEL which emits beam having 850 nm band as the light emitting element 12 and GaAs photo diode (PD) as the light receiving element 14 and employs polymer optical waveguide based on micro molding method as a optical waveguide 108 which realizes one-core two-way introduction.

The VCSEL having 850 nm band used in this embodiment needs to output light of around 1 mW in order to execute modulation in G bit class stably. If taking into account a variation in requirement for the safety of laser, the quantity of light emitted from the optical transmission device 100 needs to be set at about 0.5 mW or less. According to this embodiment, a light attenuating portion (branch core portion 109) for creating light attenuating of about 3 dB is provided in the optical transmission path 108 and about ½ the quantity of emitted light is introduced to the side of the optical fiber 16. Thus, even if the quantity of emitted light of the VCSEL is set to 1 mW which allows modulation in G bit class, the optical output of the optical transmission device 100 is less than 0.5 mW whereby satisfying the requirement for the safety of laser.

Although according to this embodiment, light directed to the light receiving element 14 is hardly attenuated because the height of the optical waveguide 108 is about 1.5 mm, light directed from the light emitting element 12 to the optical fiber 16 is attenuated by as much as 3 dB in an interval of 1.5 mm.

Eighth Embodiment

Figure 24:
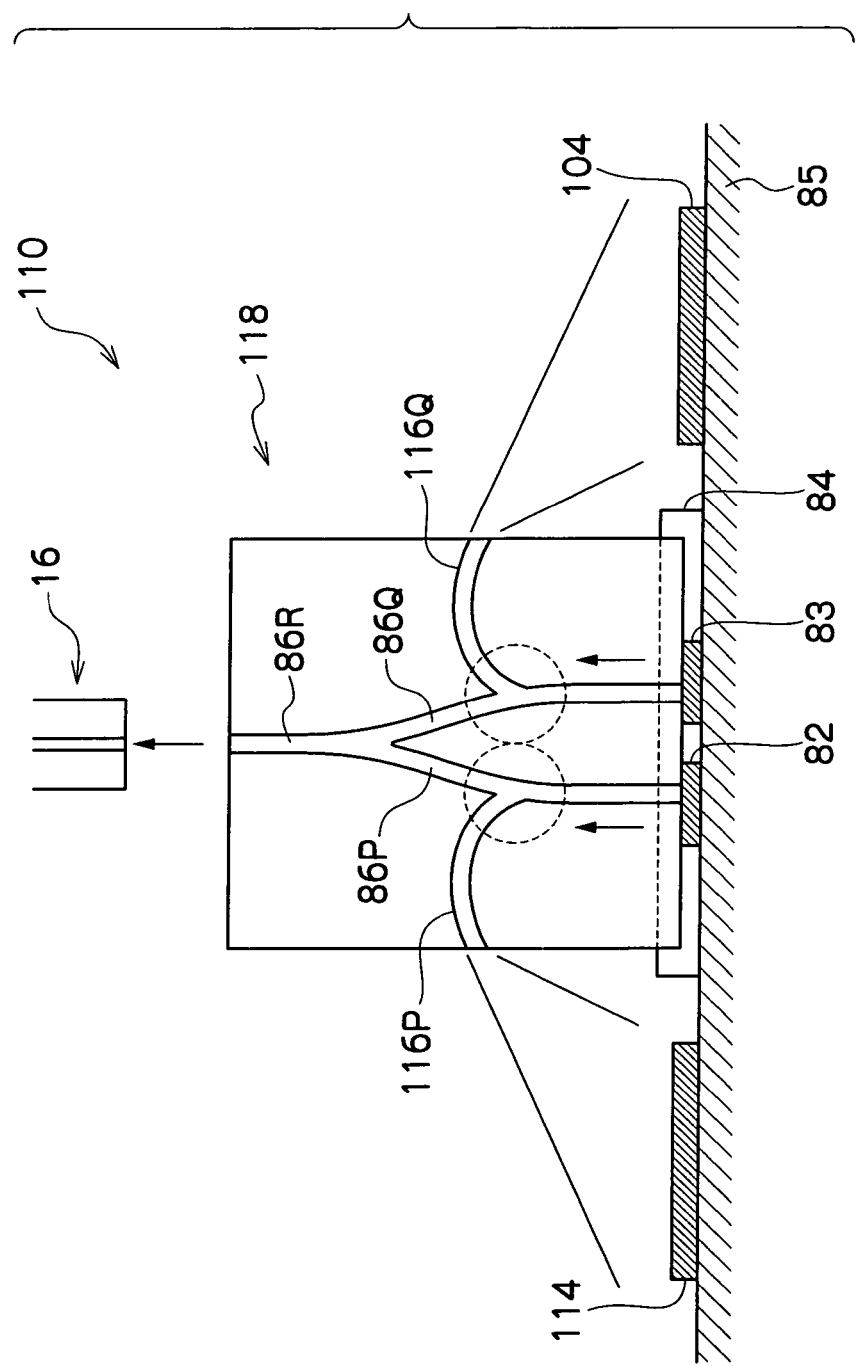
FIG. 24 is a side sectional view showing the structure of the optical transmission device according to an eighth embodiment.

Next, the eighth embodiment will be described. As shown in FIG. 24, the optical transmission device 110 of this embodiment includes an optical waveguide 118 provided with a first branch core portion 116P branched from a first light introducing portion 86P and a second branch core portion 116Q branched from a second light introducing portion 86Q instead of the optical waveguide 88, as compared with the optical transmission device 80 described in the fifth embodiment.

The second branch core portion 116Q has the same structure as the branch core portion 109 described in the seventh embodiment and the first branch core portion 116P is provided symmetrically with the second branch core portion 116Q.

The base 85 has a monitoring light receiving element 104 described in the seventh embodiment for monitoring the quantity of light from the second branch core portion 116Q. Further, the base 85 has a monitoring light receiving element 114 for monitoring the quantity of light from the first branch core portion 116P.

Because in the optical transmission device 110 which mixes two waves, like this embodiment, the limit of safety of laser with respect to the total power of two waves mixed is regulated, the amount of attenuation of the light needs to be increased with respect to the seventh embodiment and the attenuating amount can be increased easily by adjusting the width of the light introducing portion.

According to this embodiment, by disposing the optical waveguide 118 in the center of the base 85 and disposing the monitoring light receiving elements 104, 114 on the right and left sides, the light crosstalk of the both is small and the quantity of light can be controlled separately.

Ninth Embodiment

Figure 25:
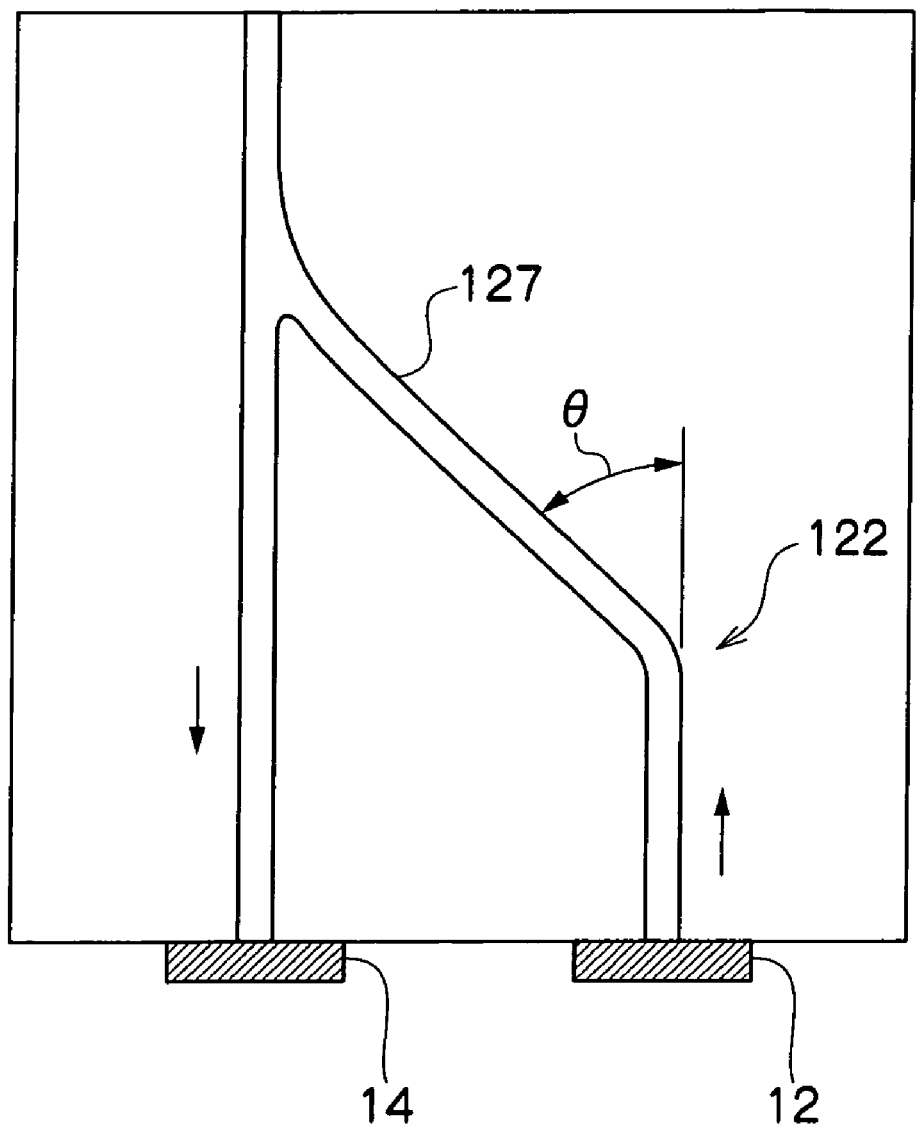
FIG. 25 is a side sectional view showing the structure of the optical transmission device and optical module according to a ninth embodiment.
Figure 26:
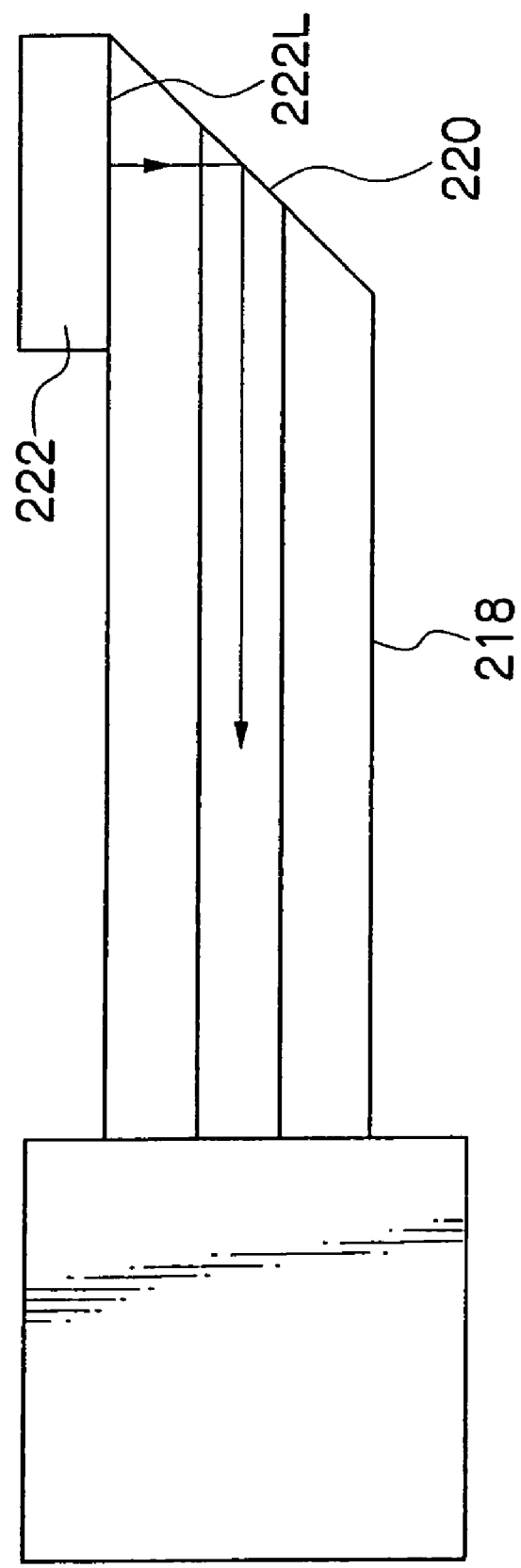
FIG. 26 is a side view showing an example of the structure of a conventional optical transmission device and optical module.

Next, the ninth embodiment will be described. As shown in FIG. 25, the optical transmission device of this embodiment includes a core branch portion 127 having a bent portion 122 which is bent at a large curvature instead of the core branch portion 27.

The curvature and bending angle $\theta$ of the bent portion 122 is set to a larger value than a critical value which increases leaking light from the bent portion 122 rapidly.

According to this embodiment, light entering the core branch portion 127 from the light emitting element 12 can be attenuated with a simple means without formation of the branch core portion.

It is permissible to incise the surface of the core branch portion 127 toward its core to allow light to leak out of the core branch portion 127.

Although the preferred embodiments of the invention have been already described above, these embodiments are just examples and the invention may be modified in various ways within a scope not departing from the spirit of the invention. Needless to say, the scope of the right of the invention is not limited to the above described embodiments.

Example of the Ninth Embodiment

This embodiment uses a polymer optical waveguide film duplicated with a mold when manufacturing an optical waveguide 148. Although the accuracy of the optical waveguide 148 is relatively not high because the width thereof is determined by cutting, the accuracies of the distance d and thickness t are high because they are determined by the thickness of the film. Thus, the thickness t and distance d can be used for formation of the positioning portion.

Incising with a dicer is easy. Additionally, the thickness t and distance d can be adjusted easily by selecting the thickness of the film. In the meantime, the optical waveguide may be manufactured according to other manufacturing method.

This embodiment employs VCSEL having a wavelength of 850 nm as the light emitting element and a GaAs made PIN photo diode as the light receiving element. An amplifier element such as preamplifier is used as the IC.

According to this embodiment, the thickness t of the optical waveguide is set to about 300 μm and the width W of the optical waveguide is set to 1000 μm. The sub-mount width B along the thickness direction of the sub-mount is set to 900 μm. Additionally, the height HS of the sub-mount is set to 500 μm and the height HD of the optical waveguide is set to 2000 μm.

The invention claimed is:

1. An optical module comprising:
   a surface-type optical element having at least one of a light emitting face and a light receiving face on the back of a mounting face;
   an optical waveguide that transmits light in the direction of a normal line of the mounting face; and
   a mounting portion that has at least a first groove configured to position the surface-type optical element and at least a second groove configured to position the optical waveguide, and the mounting portion being mounted with the surface-type optical element and the optical waveguide.

2. The optical module according to claim 1, further comprising a light transmission medium mounting portion installed in substantially the direction of the normal line of the mounting face, wherein
   a light transmission module is mounted to the optical waveguide at the light transmission medium mounting portion and the optical waveguide optically couples the surface-type optical element and the light transmission module.

3. The optical module according to claim 1, further comprising a sealing member that seals the surface-type optical element, the optical waveguide and the mounting portion.

4. The optical module according to claim 3, wherein the sealing member is composed of resin material.

5. The optical module according to claim 1, wherein the mounting portion is a sub-mount.

6. The optical module according to claim 1, wherein the mounting portion is a contoured portion of a header member.

7. The optical module according to claim 5, wherein the surface-type optical element is recessed in the sub-mount.

8. The optical module according to claim 7, wherein the sub-mount is composed of a silicone member processed by reactive ion etching.

9. The optical module according to claim 1, wherein the surface-type optical element and the optical waveguide are sealed in a metal can package.

10. The optical module according to claim 1, wherein a plurality of the surface-type optical elements are provided, and a plurality of light emitting elements each having a different wavelength are provided as the surface-type optical elements.

* * * * *